(12) United States Patent
Abe et al.

(10) Patent No.: US 8,029,224 B2
(45) Date of Patent: Oct. 4, 2011

(54) SUBSTRATE TRANSFER APPARATUS, SUBSTRATE TRANSFER METHOD, AND STORAGE MEDIUM

(75) Inventors: Yo Abe, Oshu (JP); Mitsuru Obara, Oshu (JP); Takahiro Abe, Oshu (JP)

(73) Assignee: Tokyo Electron Limited, Tokyo (JP)

( * ) Notice: Subject to any disclaimer, the term of this patent is extended or adjusted under 35 U.S.C. 154(b) by 779 days.

(21) Appl. No.: 12/076,648

(22) Filed: Mar. 20, 2008

(65) Prior Publication Data

US 2008/0232937 A1 Sep. 25, 2008

(30) Foreign Application Priority Data

Mar. 23, 2007 (JP) .................................. 2007-077530

(51) Int. Cl.
*H01L 21/00* (2006.01)
*G01N 21/86* (2006.01)
(52) U.S. Cl. ........ 414/217; 414/172; 414/938; 198/395; 250/559.33; 250/559.29
(58) Field of Classification Search ............. 414/222.02, 414/757, 936, 217, 172, 938, 275, 416; 53/478, 53/329.3; 318/568.21, 567, 640; 198/395, 198/394; 250/559.33, 559.29
See application file for complete search history.

(56) References Cited

U.S. PATENT DOCUMENTS

| | | | |
|---|---|---|---|
| 4,770,590 A * | 9/1988 | Hugues et al. ................. 414/172 |
| 5,906,469 A | 5/1999 | Oka et al. |
| 5,963,753 A * | 10/1999 | Ohtani et al. ................. 396/611 |
| 6,203,268 B1 * | 3/2001 | Miyashita ..................... 414/757 |
| 6,632,068 B2 * | 10/2003 | Zinger et al. .................. 414/800 |
| 6,822,413 B2 * | 11/2004 | Simondet ................. 318/568.21 |
| 7,105,847 B2 * | 9/2006 | Oka ......................... 250/559.33 |
| 7,699,021 B2 * | 4/2010 | Volfovski et al. ............. 118/500 |
| 2001/0024691 A1 * | 9/2001 | Kimura et al. ................ 427/346 |
| 2002/0070095 A1 * | 6/2002 | Osaka et al. .................. 198/394 |
| 2003/0198547 A1 * | 10/2003 | Coomer et al. .......... 414/416.09 |

(Continued)

FOREIGN PATENT DOCUMENTS

JP 6-246658 9/1994

(Continued)

OTHER PUBLICATIONS

Notification of Reasons for Rejection issued on Jan. 20, 2009. Chinese Office Action issued on Mar. 11, 2011 for Application No. 200810085863.8 w/English language translation.

*Primary Examiner* — Ronnie Mancho
(74) *Attorney, Agent, or Firm* — Smith, Gambrell & Russell, LLP

(57) ABSTRACT

A substrate transfer apparatus 100 includes a substrate transport means 4 having a transport base 5 and a plurality of retention arms 41*a*-41*e* for retaining substrates W, an optical sensor 62 that is used to define a horizontal optical axis L, an elevator means 52 for moving the transport base 5 up and down, and a height detection means 54 for detecting the height of the transport base 5 relative to the optical axis L. In accordance with a light-reception/no-light-reception detection result fed from the optical sensor 62 and the height of the transport base 5, a judgment means 72*a* of a control section 7 judges whether the postures of the retention arms 41*a*-41*e* relative to the horizontal plane are normal. When the judgment means 72*a* judges that the postures of the retention arms 41*a*-41*e* relative to the horizontal plane are abnormal, the control section 7 exercises control to stop the substrate transport means 4.

10 Claims, 16 Drawing Sheets

U.S. PATENT DOCUMENTS

| | | |
|---|---|---|
| 2004/0012363 A1* | 1/2004 | Simondet ................ 318/568.21 |
| 2004/0060582 A1* | 4/2004 | Sasaki et al. ................... 134/61 |
| 2005/0087441 A1* | 4/2005 | Hongo et al. ............ 204/297.06 |
| 2005/0242305 A1* | 11/2005 | Oka ......................... 250/559.29 |
| 2005/0265814 A1* | 12/2005 | Coady ....................... 414/744.5 |
| 2006/0137726 A1* | 6/2006 | Sano et al. ..................... 134/61 |
| 2007/0062446 A1* | 3/2007 | Iijima et al. .................. 118/500 |
| 2007/0151212 A1* | 7/2007 | Mayer et al. .................... 53/478 |
| 2008/0267747 A1* | 10/2008 | DiBella et al. ........... 414/225.01 |

FOREIGN PATENT DOCUMENTS

| | | |
|---|---|---|
| JP | 9-148404 | 6/1997 |
| JP | 11-179692 | 7/1999 |
| JP | 2000-124290 | 4/2000 |
| JP | 2004-39841 | 2/2004 |
| JP | 2005-51171 | 2/2005 |

\* cited by examiner

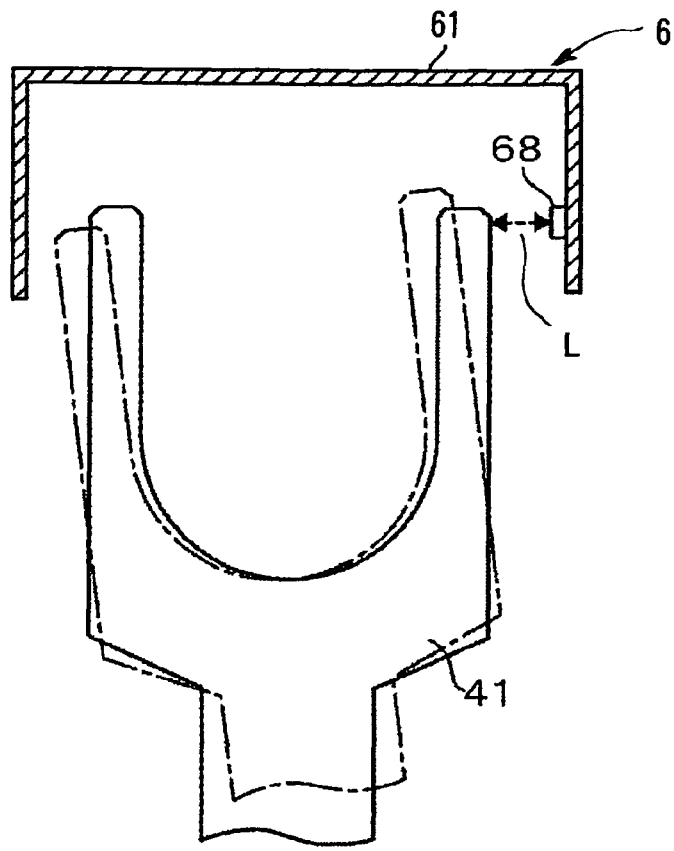
F I G. 1 4 A
| HEIGHT | DISTANCE |
|---|---|
| Z1 | W1 |
| Z2 | W2 |
| Z3 | W3 |
| Z4 | W4 |
| Z5 | W5 |
| Z6 | W6 |
| Z7 | W7 |
| Z8 | W8 |
| Z9 | W9 |
| Z10 | W10 |
F I G. 1 4 B

SUBSTRATE TRANSFER APPARATUS, SUBSTRATE TRANSFER METHOD, AND STORAGE MEDIUM

CROSS REFERENCE TO RELATED APPLICATION

The present application claims priority from Japanese application serial No. 2007-077530, filed on Mar. 23, 2007, the content of which is hereby incorporated by reference into this application.

BACKGROUND OF THE INVENTION

1. Field of the Invention

The present invention relates to a substrate transfer apparatus that is capable of properly preventing a retention arm from coming into contact with a substrate when the retention arm removes the substrate from a holder, which holds a plurality of semiconductor wafers or other substrates in a shelf form. The present invention also relates to a substrate transfer method and a storage medium for use with the substrate transfer method.

2. Description of the Related Art

A thermal treatment apparatus is used as a part of semiconductor manufacturing equipment to provide batch thermal treatment for a large number of semiconductor wafers (hereinafter referred to as "wafers"). As shown, for instance, in FIG. 16, the thermal treatment apparatus has a loading/unloading area Sa, which is used when a carrier 10 containing a plurality of wafers 1 is loaded from or unloaded to the outside. An automatic transport robot or operator loads the carrier 10 into the loading/unloading area Sa. A transfer apparatus 11 then transfers the wafers 1 in the carrier 10 to a wafer boat 12, which retains a large number of wafers 1 in a shelf form, and loads the wafer boat 12 into a thermal treatment furnace (not shown). A predetermined thermal treatment is then simultaneously provided for a large number of wafers 1.

The transfer apparatus 11 includes a base 14, which freely moves up and down, rotates around a substantially vertical axis, and moves in a substantially horizontal direction, and a plurality of forks 13, which freely move forward and backward along the base 14 and retain a large number of wafers 1 (e.g., five wafers 1). For example, five forks 13 simultaneously transport five wafers 1 between the carrier 10 and wafer boat 12 for transfer purposes. In this instance, the rim of each wafer 1 in the carrier 10 or wafer boat 12 is retained by a retainer (not shown) while a predetermined clearance is provided between the upper and lower neighboring wafers. Each of the five forks 13 is then inserted into a space beneath a wafer 1 retained by the carrier 10 or wafer boat 12. Next, each fork 13 is raised to lift the wafer 1 off the retainer to place the wafer 1 on each fork 13. Each fork 13 is then retracted to move the wafer 1 away from the carrier 10 or wafer boat 12. Subsequently, the transfer apparatus 11 transports the wafer 1 to its transfer destination.

The base end of each fork 13 is screwed down on an advance/retraction section 15. However, if, for instance, a fork 13 has been used for a long period of time or is improperly screwed down, it may look like the fourth fork 13 from the top (see FIG. 17). More specifically, the fork 13 may not be parallel to the horizontal plane or may become warped so that the leading end of the fork 13 is displaced upward or downward from its reference position.

The distance between the wafers 1 placed in the carrier 10 or wafer boat 12 is approximately 6 mm to 12 mm. Therefore, if the leading end of a fork 13 is inclined upward or downward as described above, a wafer 1 comes into contact with the fork 13 when the wafer 1 is received from the carrier 10 or wafer boat 12. Consequently, the surface of the wafer 1 may be scratched or abraded due to the contact with the fork 13. This may lead to the generation of particles.

Under the above circumstances, the wafers 1 are subjected to a surface defect inspection in which the surface of a wafer is checked, for instance, for damage or particle attachment. However, a conventional inspection apparatus for checking wafers 1 for surface defects is installed in an area apart from the thermal treatment furnace. Therefore, the wafers 1 are subjected to a predetermined thermal treatment and transported back into the carrier 10. The carrier 10 is then transported to the inspection apparatus to inspect target wafers in the carrier 10 in a predetermined manner.

If any particle, damage, or other defect is found on the surface of a wafer 1 in the above inspection process, the thermal treatment apparatus is brought to an emergency stop. The next step is performed to check whether the encountered defect is caused by the contact between a fork 13 and wafer, which is a result of upward/downward inclination of the fork 13. If so, appropriate maintenance tasks are performed, for instance, to adjust the position of the fork 13.

However, even if any surface defect is found in a situation where wafers 1 are inspected as described above after thermal treatment, the thermal treatment furnace performs a process not only on an already inspected wafer lot but also on the next wafer lot. Therefore, even if appropriate maintenance tasks are performed, for instance, to adjust the position of a fork 13 with the thermal treatment apparatus brought to an emergency stop, surface defects may be found on a large number of previously processed wafers to decrease the yield. Further, if any maintenance is performed on the fork 13 with the thermal treatment apparatus brought to an emergency stop, the apparatus cannot be operated during a period of time required for maintenance. This reduces equipment availability, thereby causing a decrease in productivity.

In recent years, the intervals at which the wafers on the wafer boat 12 are positioned tend to decrease in order to increase the number of wafers to be processed per batch with a view toward processing efficiency enhancement. In addition, the wafers tend to further increase in diameter. This increases the distance between the base end and leading end of a fork 13. Thus, it is anticipated that the inclination of the fork 13 from the horizontal plane may increase. As a result, the aforementioned problem has become evident.

As such being the case, the inventors of the present invention have conducted studies to work out a method of inspecting a fork 13 for up-down inclination before receiving a wafer 1 from the carrier 10, adjusting the position of the fork 13 to control the contact between the fork 13 and the wafer 1 in the carrier 10, and preventing the surface of the wafer 1 from being damaged. A technology for detecting the up-down inclination of a fork is proposed in JP-A-2005-51171.

The technology proposed in JP-A-2005-51171 is such that an optical sensor is mounted on a lower wall of a load lock chamber to measure the vertical distance to a blade of a wafer transport robot and measure the forward sag of the blade. However, the configuration disclosed in JP-A-2005-51171 can measure only one fork because the optical axis of the optical sensor is formed in vertical direction. Therefore, when, for instance, the employed transfer apparatus advances or retracts five forks simultaneously, the configuration disclosed in JP-A-2005-51171 cannot solve the aforementioned problem because it cannot inspect each fork for up-down inclination.

Meanwhile, the technology proposed in JP-A-2000-124290 detects the positional displacement of a wafer in a wafer cassette with a reflective photosensor and controls a robot hand in accordance with a value detected by the photosensor to prevent the robot hand from coming into contact with a wafer in the wafer cassette. However, this technology relates to the positional displacement of a wafer in a wafer cassette, and does not solve the aforementioned problem because it does not inspect a fork for up-down inclination before receiving a wafer from a carrier and adjust the position of the fork.

SUMMARY OF THE INVENTION

The present invention has been made in view of the above circumstances and provides a technology for preventing a retention arm from coming into contact with a substrate when the retention arm removes the substrate from a holder, which holds a plurality of substrates in a shelf form.

According to a first aspect of the present invention, there is provided a substrate transfer apparatus that is mounted in a substrate processing apparatus to accommodate a plurality of substrates, the substrate transfer apparatus including: a holder for holding the plurality of substrates in a shelf form; a substrate transport means that removes a substrate from the holder, the transport means including a substantially horizontal retention arm which retains the substrate and is positioned to freely advance and retract along an advance/retraction axis, and a transport base which supports the retention arm; an optical sensor that is used to define a horizontal optical axis, which crosses a circumferential side surface of the retention arm when the optical sensor ascends or descends relative to the transport base; an elevator means that is coupled to the transport base to lift or lower the transport base relative to the optical sensor; a height detection means that is connected to the elevator means to detect the height of the transport base relative to the optical axis; and a control section having a judgment means that is connected to the optical sensor and the height detection means to judge, in accordance with a light-reception/no-light-reception detection result fed from the optical sensor, which is obtained when the transport base ascends or descends relative to the optical sensor while no substrate is held by the retention arm, and the height of the transport base, whether the posture of the retention arm relative to the horizontal plane is normal; wherein, when the judgment means judges that the posture of the retention arm relative to the horizontal plane is abnormal, the control section exercises to stop the substrate transport means before a next substrate is removed from the holder.

According to a second aspect of the present invention, there is provided the substrate transfer apparatus as described in the first aspect, wherein a plurality of retention arms are stacked on the transport base so that the retention arms can advance and retract simultaneously or independently of each other.

According to a third aspect of the present invention, there is provided the substrate transfer apparatus as described in the second aspect, wherein the elevator means lifts or lowers the transport base in such a manner that the plurality of retention arms cross the optical axis of a common optical sensor, and wherein the judgment means of the control section judges whether the posture of each of the plurality of retention arms is normal.

According to a fourth aspect of the present invention, there is provided the substrate transfer apparatus as described in the first aspect, wherein a plurality of retention arms are stacked on the transport base so that the retention arms can advance and retract independently of each other, and wherein, when the posture of one retention arm is judged to be abnormal, the control section controls the substrate transport means so that another retention arm removes a substrate from the holder.

According to a fifth aspect of the present invention, there is provided the substrate transfer apparatus as described in the first aspect, wherein the judgment means of the control section also judges, in accordance with the height of the transport base and the light-reception/no-light-reception detection result fed from the optical sensor, whether the posture of the retention arm relative to the advance/retraction axis is normal.

According to a sixth aspect of the present invention, there is provided the substrate transfer apparatus as described in the first aspect, wherein the optical sensor is a distance sensor, and wherein the judgment means also judges, in accordance with the height of the transport base and the distance between the distance sensor and the retention arm, whether the left-right posture of the retention arm is normal.

According to a seventh aspect of the present invention, there is provided a substrate transfer method for use in a substrate transfer apparatus having a holder for holding a plurality of substrates in a shelf form; a substrate transport means that removes a substrate from the holder, the transport means including a substantially horizontal retention arm which retains the substrate and is positioned to freely advance and retract along an advance/retraction axis, and a transport base which supports the retention arm; and an optical sensor that is used to define a horizontal optical axis, which crosses a circumferential side surface of the retention arm when the optical sensor ascends or descends relative to the transport base; the substrate transfer method including the steps of: lifting or lowering the transport base relative to the optical sensor while no substrate is held by the retention arm and acquiring the height of the transport base relative to the optical axis and a light-reception/no-light-reception detection result fed from the optical sensor; judging, in accordance with the height of the transport base and the light-reception/no-light-reception detection result fed from the optical sensor, whether the posture of the retention arm relative to the horizontal plane is normal; and exercising control to stop the substrate transport means before a next substrate is removed from the holder when the posture of the retention arm relative to the horizontal plane is judged to be abnormal.

According to an eighth aspect of the present invention, there is provided the substrate transfer method as described in the seventh aspect, further including the step of judging, in accordance with the height of the transport base and the light-reception/no-light-reception detection result fed from the optical sensor, whether the posture of the retention arm relative to the advance/retraction axis is normal.

According to a ninth aspect of the present invention, there is provided the substrate transfer method as described in the seventh aspect, wherein the optical sensor is a distance sensor, the substrate transfer method further including the step of judging, in accordance with the height of the transport base and the distance between the distance sensor and the retention arm, whether the left-right posture of the retention arm is normal.

According to a tenth aspect of the present invention, there is provided a storage medium that stores a computer program running on a computer and is used with a substrate transfer method for use in a substrate transfer apparatus having a holder for holding a plurality of substrates in a shelf form; a substrate transport means that removes a substrate from the holder, the transport means including a substantially horizontal retention arm which retains the substrate and is positioned to freely advance and retract along an advance/retraction axis, and a transport base which supports the retention arm; and an optical sensor that is used to define a horizontal optical axis, which crosses a circumferential side surface of the retention arm when the optical sensor ascends or descends relative to the transport base; wherein the substrate transfer method includes the steps of: lifting or lowering the transport base relative to the optical sensor while no substrate is held by the retention arm and acquiring the height of the transport base relative to the optical axis and a light-reception/no-light-reception detection result fed from the optical sensor; judging, in accordance with the height of the transport base and the light-reception/no-light-reception detection result fed from the optical sensor, whether the posture of the retention arm relative to the horizontal plane is normal; and exercising control to stop the substrate transport means before a next substrate is removed from the holder when the posture of the retention arm relative to the horizontal plane is judged to be abnormal.

As described above, the present invention can prevent the retention arm from coming into contact with a substrate because it judges, before the retention arm removes the substrate from the holder holding a plurality of substrates in a shelf form, whether the front-rear posture of the retention arm relative to the horizontal plane is normal. This makes it possible to avoid substrate surface defects that may be caused by the contact between the retention arm and a substrate. Consequently, the product yield increases.

BRIEF DESCRIPTION OF THE DRAWINGS

FIGS. 14A and 14B illustrate a process for inspecting the left-right inclination of the wafer transport mechanism.

DETAILED DESCRIPTION OF THE PREFERRED EMBODIMENTS

Figure 1:
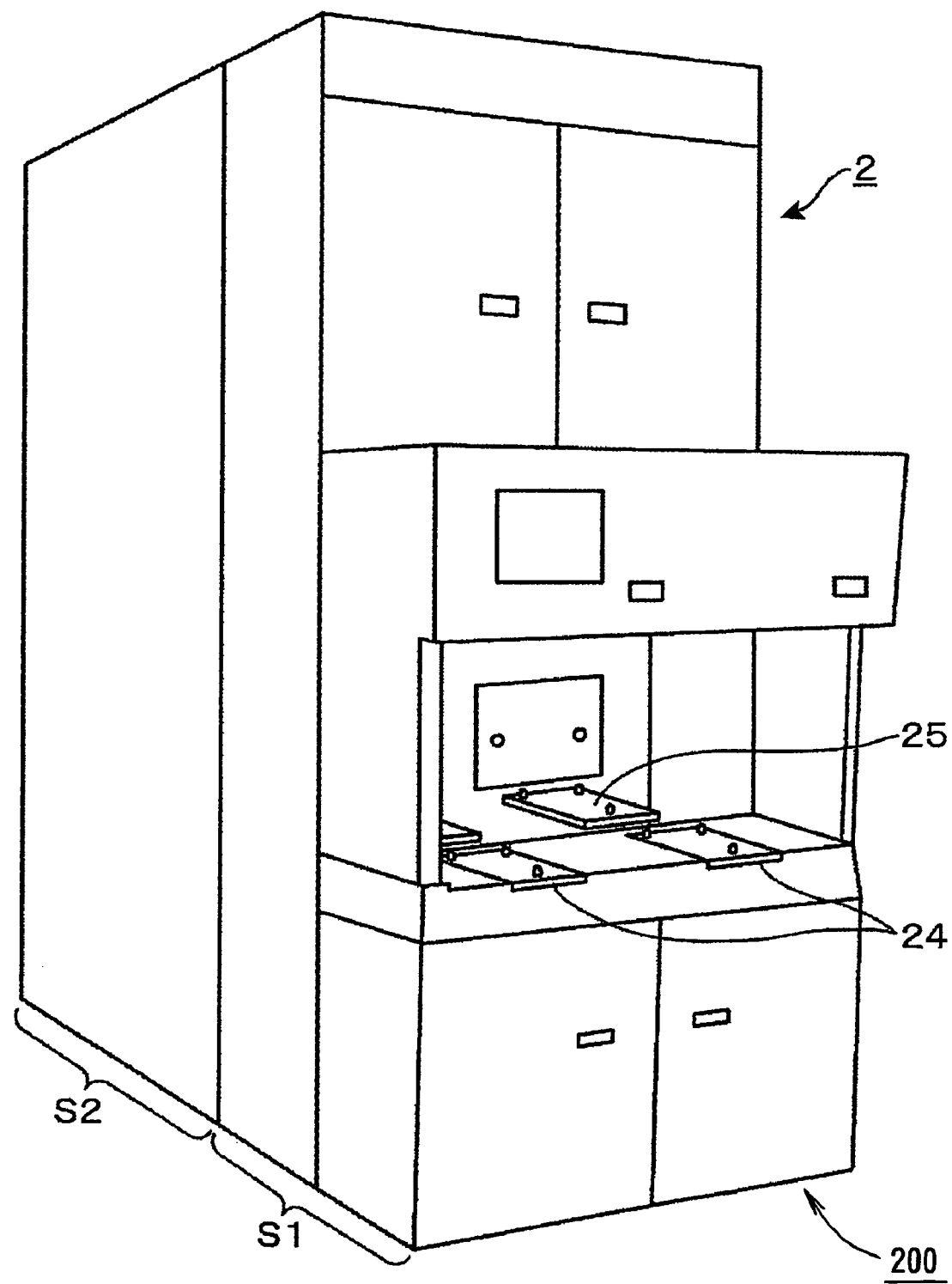
FIG. 1 is a perspective view illustrating the overall configuration of a substrate transfer apparatus according to an embodiment of the present invention.
Figure 2:
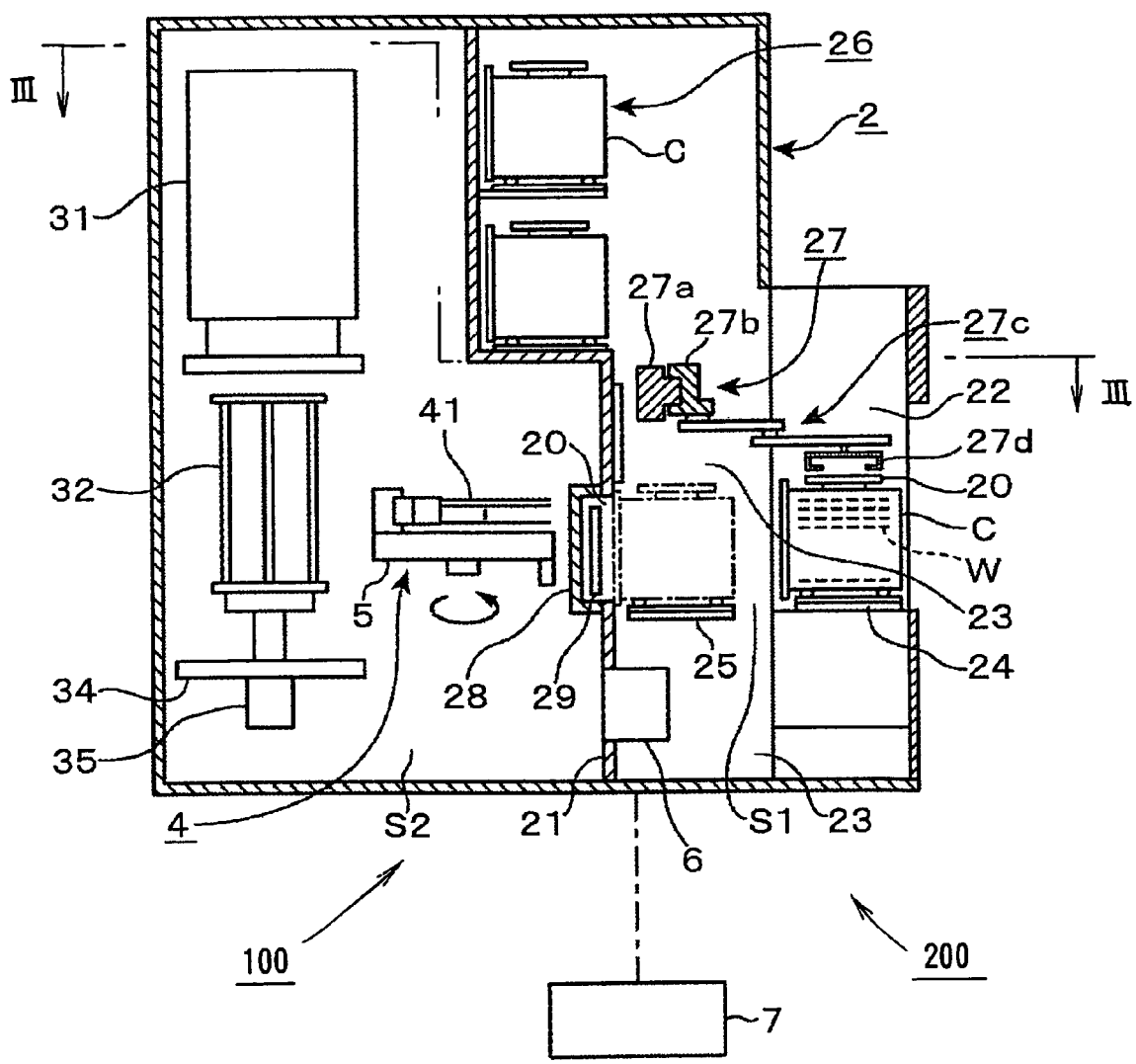
FIG. 2 is a vertical cross-sectional view illustrating the substrate transfer apparatus.
Figure 3:
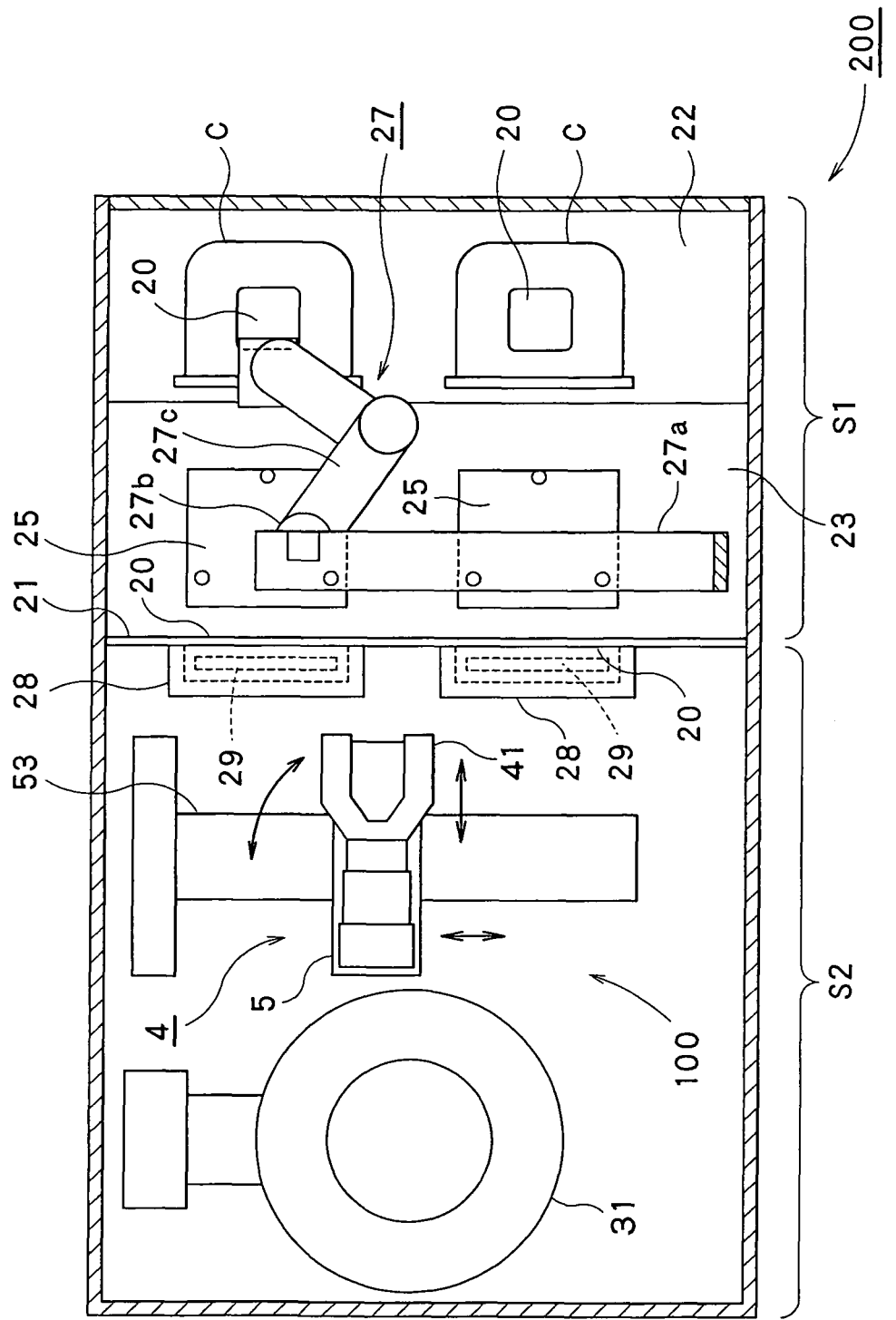
FIG. 3 is a horizontal cross-sectional view illustrating the substrate transfer apparatus (a cross-sectional view taken along line III-III in FIG. 2).
Figure 4:
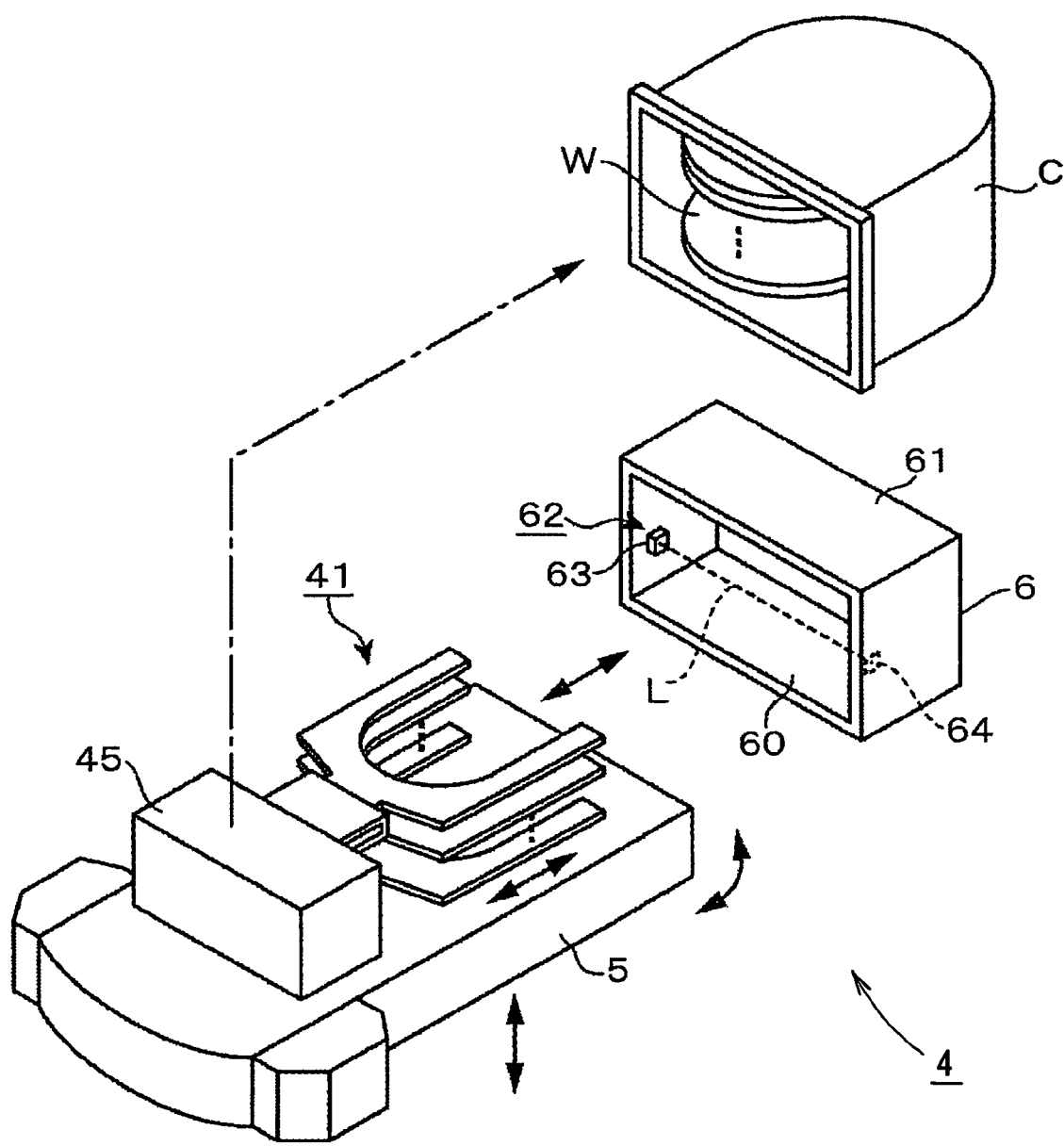
FIG. 4 is a schematic perspective view illustrating a wafer transport mechanism, carrier, and inspection unit in the substrate transfer apparatus.

An embodiment in which a substrate transfer apparatus according to the present invention is applied to a vertical thermal treatment apparatus will now be described. FIG. 1 is a perspective view illustrating the overall configuration of the vertical thermal treatment apparatus. FIG. 2 is a longitudinal side view illustrating the interior of the vertical thermal treatment apparatus. FIG. 3 is a schematic horizontal cross-sectional view illustrating the interior of the vertical thermal treatment apparatus.

Referring to FIGS. 1 to 3, the vertical thermal treatment apparatus 200 accommodates a plurality of wafers W (substrates) and heat-treats the plurality of wafers W. The substrate transfer apparatus 100 is provided for the vertical thermal treatment apparatus 200. The reference numeral 2 in the figures denotes a housing that constitutes an enclosure for the vertical thermal treatment apparatus 200. The housing 2 contains a loading/unloading area S1 and a loading area S2. The loading/unloading area S1 is used to load or unload a carrier (holder) C, which contains a wafer W, into or from the vertical thermal treatment apparatus 200. The loading area S2 is a transfer area for loading the wafer W in the carrier C into a thermal treatment furnace, which will be described later. There is a partition wall 21 between the loading/unloading area S1 and loading area S2. The loading/unloading area S1 is in aerial atmosphere. The loading area S2 is in inert gas atmosphere such as nitrogen (N2) gas atmosphere or clean, dry gas (air having few particles and organic constituents and a dew point of not higher than −60 C) atmosphere.

The loading/unloading area S1 includes a first area 22, which is positioned forward as viewed from the front of the vertical thermal treatment apparatus 200, and a second area 23, which is positioned rearward. The first area 22 is provided with a first mounting base 24 on which, for instance, two carriers C are placed. A closed carrier C made, for instance, of resin is used. The front outlet (not shown) of the carrier C is stopped up with a cover. In the carrier C, for example, a plurality of 300 mm diameter substrates or wafers W (e.g., 25 wafers W) are arranged at predetermined intervals in a shelf form. The second area 23 of the loading/unloading area S1 is provided with a second mounting base 25. The upper section of the second area 23 is provided not only with a carrier storage section 26, which stores the carrier C, but also with a carrier transport mechanism 27, which transports the carrier C between the first mounting base 24, the second mounting base 25, and the carrier storage section 26. The carrier transport mechanism 27 is allowed to freely ascend and descend and provided with an elevator means 27a, a movement section 27b, and an arm 27c. The elevator means 27a includes a guide rail that is extended from left to right as viewed from the front of the vertical thermal treatment apparatus 200. The movement section 27b moves to the right or left as it is guided by the guide rail. The arm 27c is provided in the movement section 27b to transport the carrier C in horizontal direction while a retention section 27d retains a flange section 20 on the upper surface of the carrier C.

The partition wall 21 has an opening 20 that establishes communication between the carrier C and loading area S2 when the carrier C placed on the second mounting base 25 comes into contact with the partition wall 21. A portion of the partition wall 21 that is positioned toward the loading area S2 is provided not only with a door 28, which opens and closes the opening 20, and a cover open/close mechanism 29, which opens and closes the cover for the carrier C while the door 28 is closed. The door 28 includes a door open/close mechanism (not shown), which is configured to retract the cover open/close mechanism 29 and cover, for instance, upward or downward for the purpose of allowing a wafer W to be transferred. The border of the opening 20 in the partition wall 21 is provided with an inert gas supply pipe (not shown). The lower end of the opening 20 is provided with an exhaust path (not shown). The inert gas supply pipe and exhaust path constitute a gas replacement means that supplies a nitrogen gas or other inert gas into the carrier C while it is uncovered and replaces the internal air with the supplied gas.

The loading area S2 is provided with a vertical thermal treatment furnace 31 whose lower end opens as a furnace opening. A wafer boat 32 is positioned beneath the thermal treatment furnace 31. The wafer boat 32 is a substrate holder that retains a large number of wafers W while they are arranged in a shelf form at predetermined intervals (so that, for instance, the distance between the upper surface of an upper wafer and the upper surface of a lower neighboring wafer is approximately 8 to 16 mm). The wafer boat 32 is placed over a cap 34. The cap 34 is supported by an elevator mechanism 35. The elevator mechanism 35 loads or unloads the wafer boat 32 into or from the thermal treatment furnace 31. A wafer transport mechanism (substrate transport means) 4 is positioned between the wafer boat 32 and the opening 20 in the partition wall 21. The wafer transport mechanism 4 transports wafers between the wafer boat 32 and the carrier C on the second mounting base 25. Further, an inspection unit 6 is placed within the loading area S2 so that it can be accessed by the wafer transport mechanism 4. In the present embodiment, the inspection unit 6 is positioned below the opening 20.

The wafer transport mechanism 4 and inspection unit 6 will now be described in detail with reference to the accompanying drawings. First of all, the overall configuration of the wafer transport mechanism 4 will be described with reference to FIGS. 4 to 7. The wafer transport mechanism 4 includes five substantially horizontal retention arms (forks 41 (41a-41e)), which retain wafers W, and a transport base 5, which supports the forks 41a-41e while allowing them to freely advance and retract.

Figure 5:
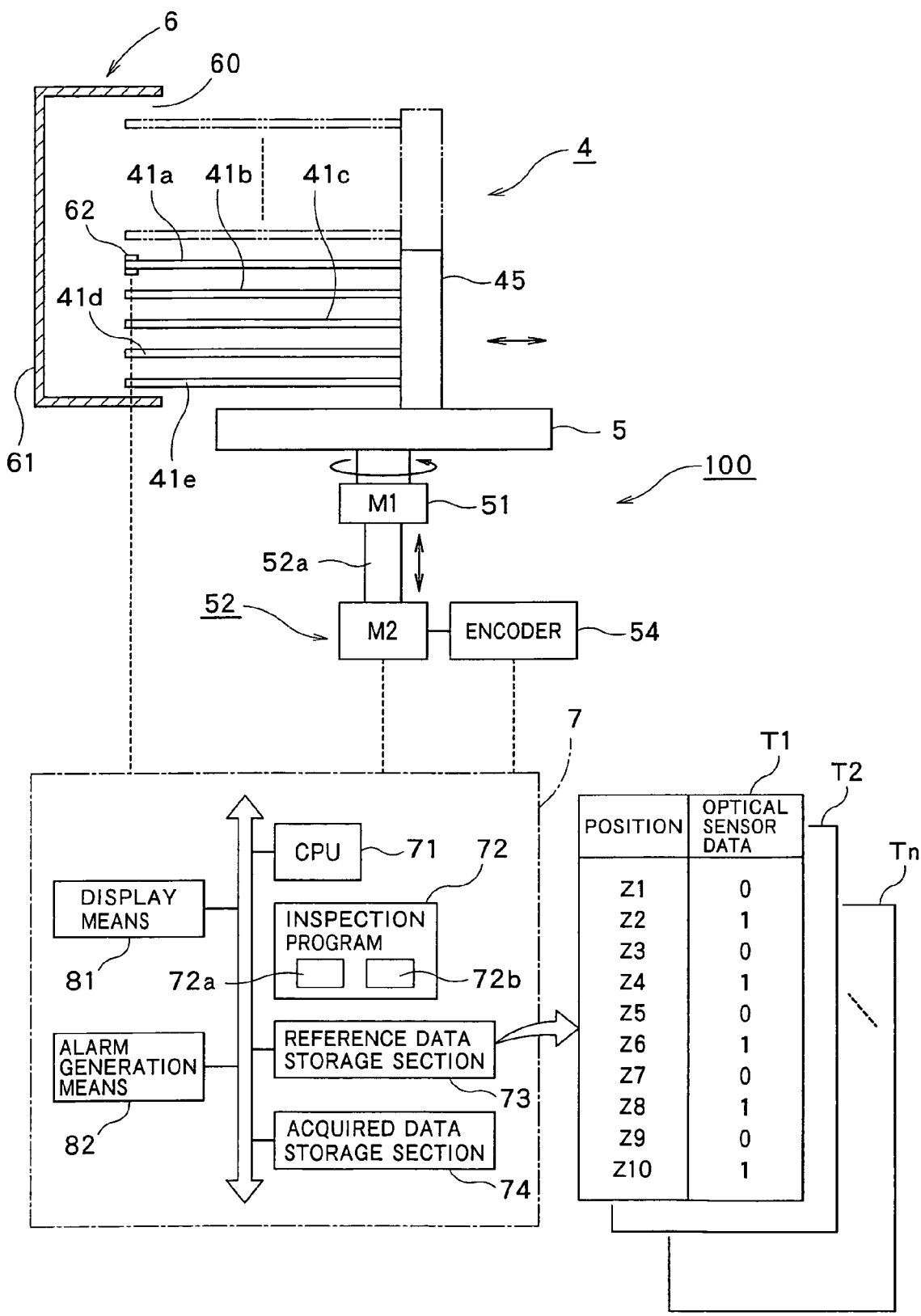
FIG. 5 is a diagram illustrating the configurations of the wafer transport mechanism and control section.

As shown in FIG. 5, the transport base 5 is coupled to a rotation mechanism 51, which includes a motor M1. The rotation mechanism 51 is coupled to an elevator mechanism 52. The elevator mechanism 52 is coupled to a guide rail 53 that is extended from left to right in the arrangement direction of carriers C (see FIG. 3). In other words, the transport base 5 is configured to freely pivot around a vertical axis due to the rotation mechanism 51, freely ascend and descend due to the elevator mechanism 52, and freely move leftward and rightward along the guide rail 53. The elevator mechanism 52 includes an elevator shaft 52a and a motor M2, which moves the elevator shaft 52a up and down. The elevator shaft 52a of the elevator mechanism 52 ascends and descends due to the rotation of the motor M2, thereby moving the transport base 5 up and down. The motor M2 is connected to an encoder 54.

The forks 41, namely, a first fork 41a, a second fork 41b, a third fork 41c, a fourth fork 41d, and a fifth fork 41e, retain, wafers W, respectively. As shown, for instance, in FIG. 7, the forks 41a-41e each include two arms 42a, 42b, which are extended in the advance/retraction direction with a predetermined space positioned between them as viewed from above. As shown, for instance, in FIGS. 6 and 7, the forks 41a-41e each include stepped sections 43a, 43b, 43c, 43d, which are formed at two locations on the leading ends of the arms 42a, 42b and at two locations on the base ends of the arms 42a, 42b. When the rim of a wafer W is placed on the stepped sections 43a, 43b, 43c, 43d of the individual forks 41a-41e, the wafer W can be retained while it is slightly lifted above the surface of each fork 41. The base end of each fork 41 is attached to an advance/retraction mechanism 45 through a retention member 44.

Figure 6:
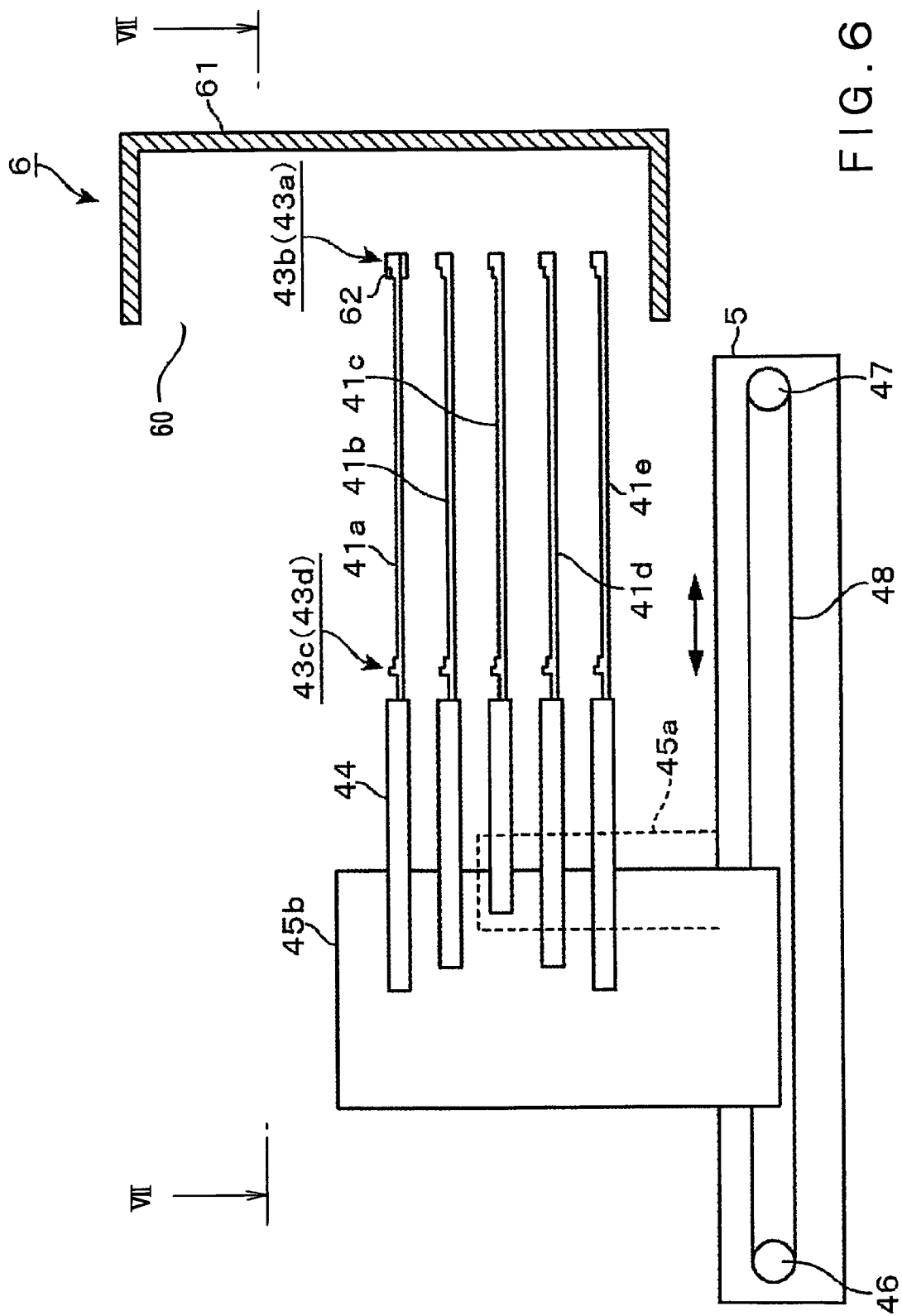
FIG. 6 is a vertical cross-sectional view illustrating the wafer transport mechanism and inspection unit.
Figure 7:
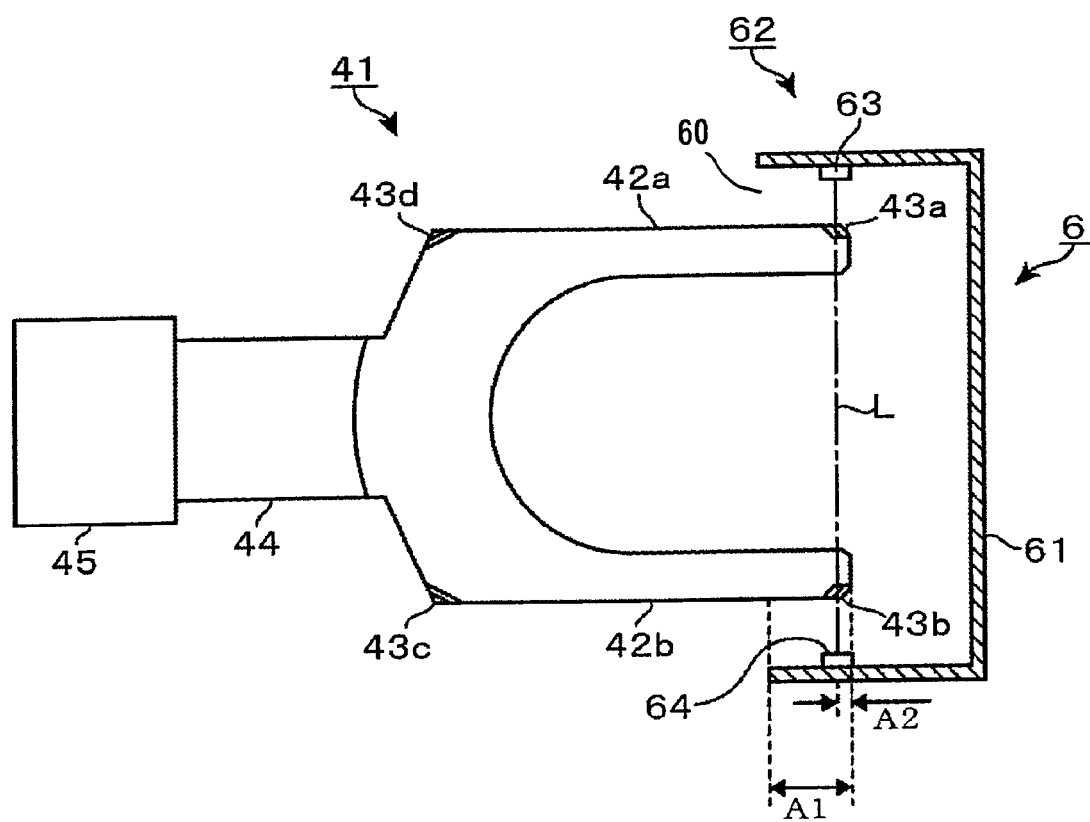
FIG. 7 is a plan view illustrating the wafer transport mechanism and inspection unit (a view taken along line VII-VII in FIG. 6).

The advance/retraction mechanism 45 will be described below with reference to FIG. 6. The forks 41a-41e shown in FIG. 6 are configured so that the third fork 41c, for example, can advance and retract along the transport base 5 on an individual basis. Forks 41a, 41b, 41d, 41e other than the third fork 41c are configured to simultaneously advance and retract. The transport base 5 includes a first advance/retraction mechanism 45a for moving the third fork 41c forward and a second advance/retraction mechanism 45b for simultaneously moving the other four forks 41a, 41b, 41d, 41e forward. The first and second advance/retraction mechanisms 45a, 45b are respectively positioned to freely advance and retract in front-rear direction along the transport base 5.

The second advance/retraction mechanism 45b includes a driving pulley 46 and a driven pulley 47, which are respectively positioned at one longitudinal end of the transport base 5 and at the other longitudinal end. The driving pulley 46 is driven by a stepping motor (not shown), which serves as an advance/retraction movement drive section. The driven pulley 47 operates in coordination with the driving pulley 46. A timing belt 48 is threaded around the driving pulley 46 and driven pulley 47. The lower end of the second advance/retraction mechanism 45b is connected to the timing belt 48. The upper surface of the transport base 5 is slit (not shown) to permit the movement of the second advance/retraction mechanism 45b. The first advance/retraction mechanism 45a is configured the same as the second advance/retraction mechanism 45b. As described above, the wafer transport mechanism 4 is configured to perform not only an individual wafer transport operation but also a collective wafer transport operation. In an individual wafer transport operation, the first advance/retraction mechanism 45a operates independently to transport one wafer W. In a collective wafer transport operation, the first and second advance/retraction mechanisms 45a, 45b cooperate to simultaneously transport a plurality of wafers W (e.g., five wafers).

The inspection unit 6 will now be described. The inspection unit 6 checks whether the front-rear posture of each fork 41a-41e relative to the horizontal plane is normal. Whether the posture is normal is determined by checking whether the leading ends of the forks 41a-41e are vertically inclined. The inspection unit 6 is placed in a position at which the forks 41a-41e can access the inspection unit 6 or placed below the second mounting base 25 in the current example so that the plane accessed by the forks 41a-41e is open within the loading area S2.

The inspection unit 6 includes a housing 61 having an opening 60 in its front surface and an optical sensor 62 mounted inside the housing 61. The leading ends of the forks 41a-41e can be inserted at a time into an inspection position within the housing 61 through the opening 60. Further, the housing 61 has an adequate space so that the inserted forks 41a-41e can simultaneously ascend or descend.

For example, a transmissive optical sensor is used as the optical sensor 62. The optical sensor 62 is positioned within the housing 61 in such a manner as to form a horizontal optical axis L. More specifically, the optical sensor 62 has a light emission section 63, which is mounted on one sidewall of the housing 61, and a light reception section 64, which is positioned on the optical axis L of the light emission section 63 to face the light emission section 63. The optical sensor 62 can freely ascend and descend relative to the transport base 5 of the wafer transport mechanism 4. More specifically, when the optical sensor 62 ascends or descends relative to the transport base 5, the optical axis L of the optical sensor 62 crosses the circumferential side surfaces of the forks 41a-41e. The elevator mechanism 52 corresponds to the elevator means, and the encoder 54 corresponds to the height detection means that detects the height of the transport base 5 relative to the optical axis L. Information about the height of the transport base 5 relative to the optical axis L is output to a control section 7 through the encoder 54. The inspection position is a position in which, for instance, approximately 40 mm leading end portions (distance A1 in FIG. 7) of the forks 41a-41e are inserted into the housing 61.

The size of the housing 61 and the mounting position of the optical sensor 62 are set so that when, for instance, the forks 41a-41e are inserted into the inspection position as shown in FIG. 6, the optical axis L of the optical sensor 62 is positioned immediately above the uppermost fork 41a, and that when the forks 41a-41e move upward from the inspection position, the lowermost fork 41e is positioned immediately above the optical axis L of the optical sensor 62. In the above instance, it is preferred, for instance, that the optical axis L be positioned approximately 5 to 10 mm (distance A2 in FIG. 7) away from the leading ends of the forks 41a-41e. Distance A1 and distance A2 can be freely set as far as A1>A2. In the current example, however, distance A2 is set so that the optical axis L is positioned in relation to the side surfaces near the stepped sections 43a, 43b for the wafers W placed on the forks 41a-41e.

For example, a fiber sensor may be used as the optical sensor 62. The use of the fiber sensor makes it possible to achieve highly accurate detection because a light emission angle setting of 2 to 3 degrees can be employed. A light-reception/no-light-reception detection result produced by the optical sensor 62 is output to the control section 7, which will be described later.

The control section 7 included in the substrate transfer apparatus 100 will now be described with reference to FIG. 5. The control section 7 is, for instance, a computer, and includes a data processing section that is composed of a program, a memory, and a CPU 71. The program incorporates instructions (various steps) so that the control section 7 sends control signals to various sections of the substrate transfer apparatus 100 to perform a transport sequence described later. The screen of the computer serves as a display means 81. The display means 81 not only makes it possible to select a predetermined substrate process and inspection process and enter parameters for each process, but also displays inspection results, which will be described later. The program is stored in a storage section of a computer storage medium such as a flexible disk, compact disc, hard disk, or MO disk (magnetooptical disk), and installed in the control section 7.

The control section 7 further includes an inspection program 72, which checks the front-rear posture of each fork 41a-41e of the wafer transport mechanism 4 relative to the horizontal plane, a reference data storage section 73, and an acquired data storage section 74. The control section 7 is connected to the elevator mechanism 52 for the forks 41a-41e, encoder 54, optical sensor 62, computer display means 81, and alarm generation means 82, and configured to send predetermined control signals to such connected components.

The reference data storage section 73 stores reference tables T1-Tn. The reference tables T1-Tn predefine the relationship between the height data about the transport base 5 that prevails while the front-rear posture of each fork 41a-41e relative to the horizontal plane is normal and the light-reception/no-light-reception data (detection result) that is fed from the optical sensor 62 to indicate whether the optical axis L is intercepted in the above instance. The forks 41a-41e are configured so that the vertical arrangement intervals between them can be changed. Therefore, not only a plurality of reference tables related to the arrangement intervals but also a reference table for use in an inspection based on a different method described later are prepared and stored in the reference data storage section 73.

The light-reception/no-light-reception data supplied from the optical sensor 62 is acquired as "1 (ON)" when light is received or as "0 (OFF)" when the light is not received. The reference tables T1-Tn are created when the wafer transport mechanism 4 providing each fork 41a-41e with a normal front-rear posture relative to the horizontal plane is used to move the transport base 5 upward or downward relative to the optical axis L so as to let all forks 41a-41e cross the optical axis L, acquire the resulting height of the transport base 5 as a pulse value for the encoder 54, obtain a light-reception/no-light-reception detection result from the optical sensor 62, and acquire a pulse pattern representing the relationship between the obtained pulse value and detection result. The acquired data storage section 74 acquires and stores the height of the transport base 5 and the light-reception/no-light-reception data fed from the optical sensor 62 when the transport base 5 of the wafer transport mechanism 4 for an inspection target ascends or descends relative to the optical axis L.

The inspection program 72 includes a control means 72b for controlling the drive of the wafer transport mechanism 4 during an inspection and a judgment means 72a for judging whether the postures of the forks 41a-41e are normal. The judgment means 72a compares the acquired data stored in the acquired data storage section 74 against the reference tables T1-Tn stored in the reference data storage section 73, and judges whether the postures of the forks 41a-41e are normal. When the postures of the forks 41a-41e are normal, the control section 7 outputs a start instruction to the wafer transport mechanism 4 for telling it to start removing the next wafer W from the carrier C. If, on the other hand, any abnormal posture is found, the control section 7 not only outputs a stop instruction to the wafer transport mechanism 4 for telling it to stop removing the next wafer W from the carrier C, but also outputs a predetermined alarm display instruction to the wafer transport mechanism 4. In the current example, the alarm generation means 82 performs an alarm display operation, for instance, by illuminating a lamp, generating an alarm sound, or displaying an alarm message on the display means 81.

The flow of wafers W in the vertical thermal treatment apparatus 200 described above will now be described. First of all, an automatic transport robot not shown, which moves along the ceiling of a clean room, places the carrier C on the first mounting base 24. The carrier transport mechanism 27 then places the carrier C on the second mounting base 25. The carrier C is brought into contact with the opening 20 in the partition wall 21 in an airtight manner by a mechanism not shown. In some cases, the carrier C may be first stored in the carrier storage section 26 and then transported to the second mounting base 25.

Next, the cover open/close mechanism 29 removes the cover from the carrier C. The gas supply pipe (not shown) then blows a nitrogen gas or other inert gas into the carrier C. Therefore, the gas in the carrier C and in the space between the carrier C and door 28 is replaced by the nitrogen gas. Subsequently, the door 28, cover open/close mechanism 29, and cover, for instance, ascend to retract from the opening 20 so that the interior of the carrier C communicates with the loading area S2. Next, the wafer transport mechanism 4 sequentially removes the wafers W from the carrier C and transfers them to the wafer boat 32. When the carrier C is emptied of the wafers W, the cover for the carrier C closes in a manner reverse to the above-mentioned manner. Further, the second mounting base 25 retracts to move the carrier C away from the partition wall 21. The carrier C is transported into the carrier storage section 26 by the carrier transport mechanism 27 and temporarily stored. Meanwhile, when a predetermined number of wafers W are placed in the wafer boat 32, the wafer boat 32 is loaded into the thermal treatment furnace 31. In the thermal treatment furnace 31, the wafers W are subjected to thermal treatment processes such as CVD, annealing, and oxidation processes. Upon completion of the thermal treatment processes, the wafers W are put back into the carrier C in a manner reverse to the above-mentioned manner.

Figure 8:
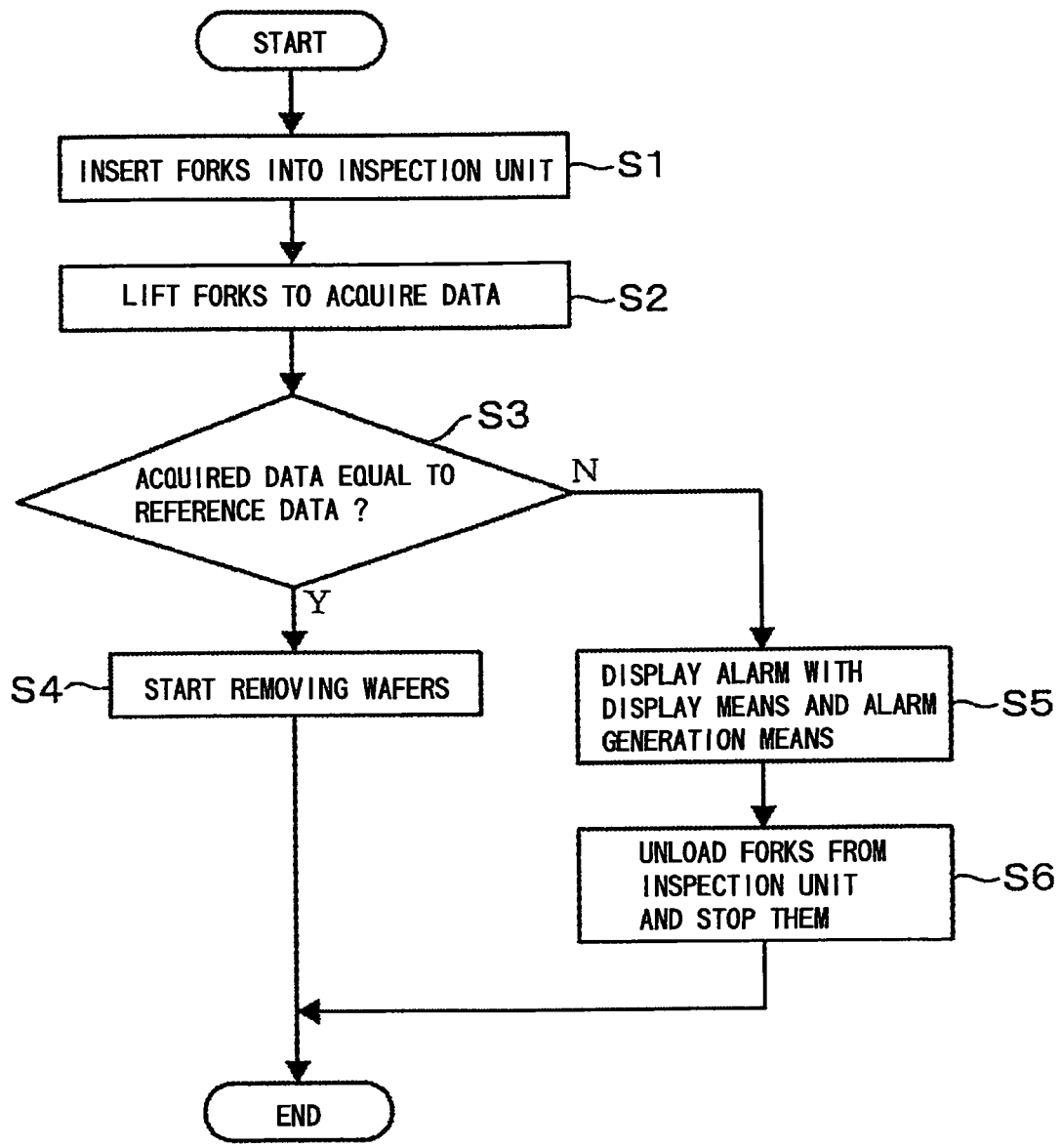
FIG. 8 is a flowchart illustrating an inspection process of the wafer transport mechanism.

The inspection process of the wafer transport mechanism 4 will now be described with reference to FIGS. 8 to 10. The inspection process is performed, for instance, at apparatus startup, during a period of time during which no lot processing is performed (e.g., while a cleaning process is performed on the wafer boat 32), or while a process is performed to replace the gas in the carrier C and in the space between the carrier C and door 28 with a nitrogen gas with the carrier C placed on the mounting base 24 and uncovered. An alternative would be to perform the inspection process each time the wafers W are removed from the carrier C or wafer boat 32, each time a predetermined number of wafers W are removed, or at predetermined time intervals.

Figure 9A:
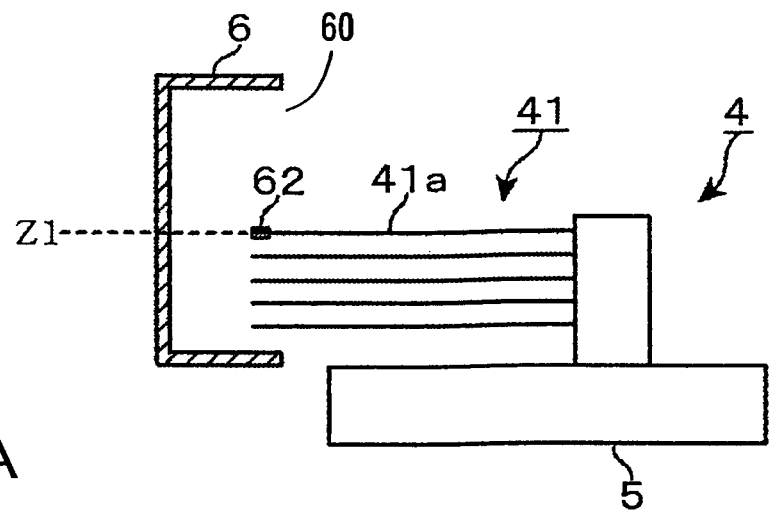
FIGS. 9A to 9C are process charts illustrating an inspection process of the wafer transport mechanism.
Figure 9B:
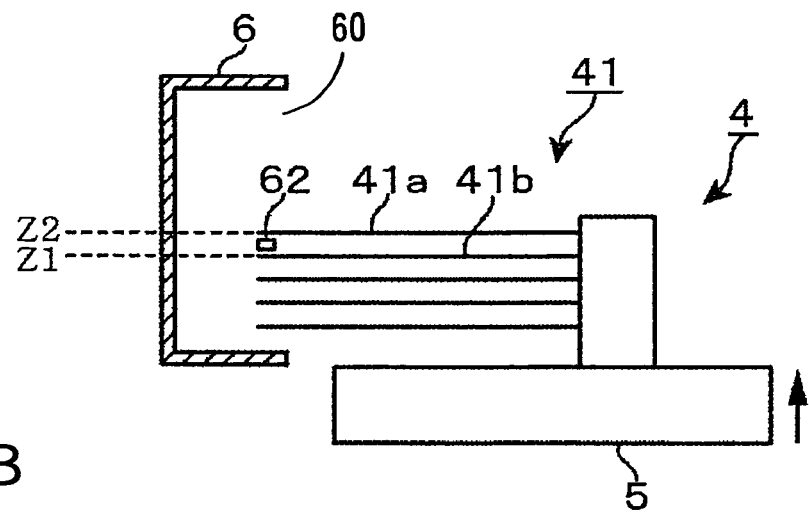
Figure 9C:
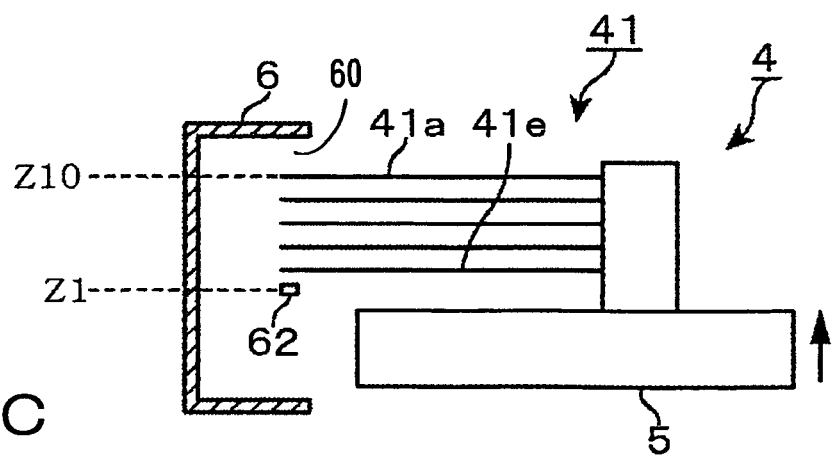

The inspection process starts when, for instance, the display means 81 of the computer is used to select a predefined reference table T1. First of all, step S1 is performed to face the five forks 41a-41e toward the opening 60 in the housing 61 and simultaneously insert their leading ends into the inspection position of the inspection unit 6 as shown in FIG. 9A. Next, the transport base 5 is moved to a first height Z1 described later. Subsequently, the transport base 5 is lifted up to a tenth height Z10 described later as shown in FIGS. 9B and 9C. In this instance, the control section 7 acquires light-reception/no-light-reception data from the optical sensor 62. Each time the data is acquired from the optical sensor 62 at various heights Z1-Z10, the control section 7 compares the acquired data against the data in the reference table T1 and judges whether the data match (steps S2 and S3).

The first to tenth heights Z1-Z10 stored in the reference table T1 will be described below. The first height Z1 is a height at which the circumferential side surface of the first fork 41a crosses the optical axis L. The second height Z2 is a height at which the optical axis L of the optical sensor 62 is positioned between the first fork 41a and the second fork 41b. The third height Z3 is a height at which the circumferential side surface of the second fork 41b crosses the optical axis L. The fourth height Z4 is a height at which the optical axis L is positioned between the second fork 41b and the third fork 41c. The fifth height Z5 is a height at which the circumferential side surface of the third fork 41c crosses the optical axis L. The sixth height Z6 is a height at which the optical axis L is positioned between the third fork 41c and the fourth fork 41d. The seventh height Z7 is a height at which the circumferential side surface of the fourth fork 41d crosses the optical axis L. The eighth height Z8 is a height at which the optical axis L is positioned between the fourth fork 41d and the fifth fork 41e. The ninth height Z9 is a height at which the circumferential side surface of the fifth fork 41e crosses the optical axis L. The tenth height Z10 is a height at which the optical axis L is positioned beneath the fifth fork 41e. These heights are acquired in advance as pulse values for the encoder 54 when the reference table T1 is created. At the time of inspection, the height of the transport base 5 relative to the optical axis L is determined by the pulse values for the encoder 54; therefore, the data of the optical sensor 62 that prevails when the transport base 5 is positioned at the various heights Z1-Z10 is acquired.

Figure 10A:
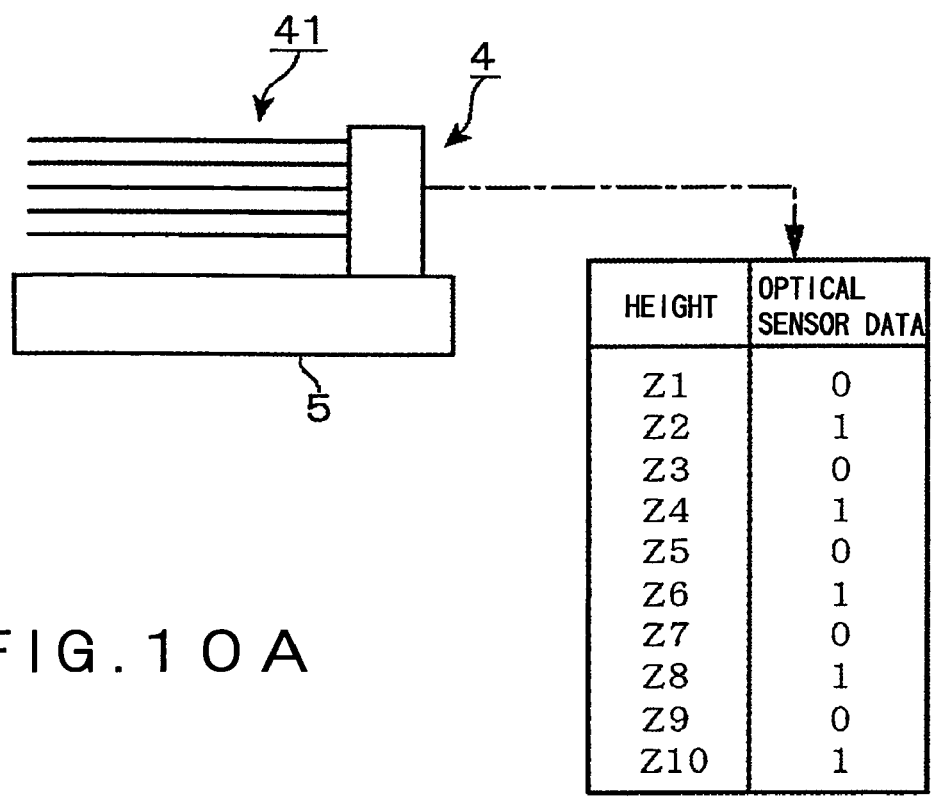
FIGS. 10A and 10B are process charts illustrating an inspection process of the wafer transport mechanism.
Figure 10B:
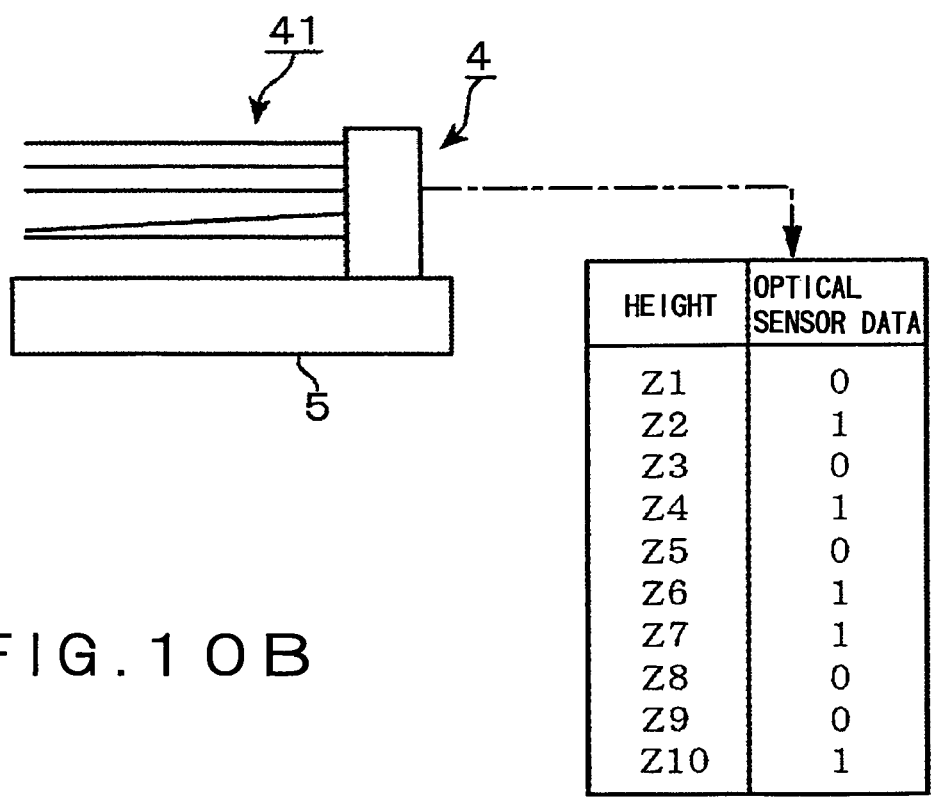

If the result obtained when the judgment means 72a of the control section 7 compares the acquired data against the data in the reference table T1 indicates that all the acquired data agree with a signal pattern in the reference table T1 as shown in FIG. 10A, the judgment means 72a of the control section 7 judges that the postures of the forks 41a-41e are normal, and outputs an instruction to the wafer transport mechanism 4 to tell it to start removing the next wafer W from the carrier C (step S4). If, on the other hand, any acquired data conflicts with the data in the reference table T1 as shown in FIG. 10B, the judgment means 72a of the control section 7 judges that an abnormality exists in the postures of the forks 41a-41e. An example shown in FIG. 10B indicates that the leading end of the fourth fork 41d is inclined downward. In this case, the fourth fork 41d does not exist, for instance, at the seventh height Z7; therefore, the data fed from the optical sensor 62 is "1", which indicates that the light is received. At the eighth height Z8, however, the optical axis L is intercepted by the fourth fork 41d, which is drooped downward; therefore, the data fed from the optical sensor 62 is "0", which indicates that the light is not received. As a result, the data acquired at the time of inspection differs from the data in the reference table T1 as shown in FIG. 10B. It should be noted that the judgment means 72a may compare the acquired data against the data in the reference table T1 each time individual data is acquired from the optical sensor 62 or after all the data are acquired.

If it is judged that an abnormality exists in the postures of the forks 41a-41e as mentioned above, the control section 7 outputs an instruction to the computer display means 81 and alarm generation means 82 to tell them to display an alarm (step S5). In addition, the control section 7 outputs an instruction to the wafer transport mechanism 4 to tell it to unload the forks 41a-41e from the inspection unit 6 and stop them before removing the next wafer W from the carrier C (step S6). Next, the operator performs adjustment and maintenance tasks until the forks 41a-41e are parallel to the horizontal plane. Subsequently, an operation for removing the next wafer W from the carrier C begins. The wafers W are then sequentially removed from the carrier C and transferred to the wafer boat 32 in the same manner as described earlier.

Before allowing the wafer transport mechanism 4 to remove the wafers W from the carrier C, the apparatus described above checks whether the postures of the forks 41a-41e are normal. If any abnormality is found in the postures of the forks, the wafer transport mechanism 4 does not remove the wafers W from the carrier C. However, the wafer transport mechanism 4 removes the wafers W from the carrier C after the forks 41a-41e are adjusted. Therefore, it is possible to prevent the forks 41a-41e from coming into contact with the wafers W when the wafers W are removed from the carrier C. This makes it possible to prevent the wafers W from being damaged by such contact, avoid the generation of particles, and inhibit the product yield from decreasing. The wafers W cannot be shipped as a product if they are slightly scratched or if particles are attached to them. Consequently, preventing the forks 41a-41e from coming into contact with the wafers W is effective in inhibiting the yield from decreasing.

Further, the process for inspecting the forks 41a-41e is performed in parallel, for instance, with a process for replacing the gas in the carrier C with an inert gas as described earlier. This eliminates the necessity of separately providing the time for the inspection of the forks 41a-41e, thereby avoiding a decrease in throughput. Furthermore, even if the forks 41a-41e assumes an abnormal posture, the forks 41a-41e are adjusted before removing the next wafer W from the carrier C. Therefore, the apparatus does not come to an emergency stop during wafer W processing unlike a conventional apparatus. This eliminates the possibility of a decrease in apparatus availability, thereby inhibiting productivity from decreasing.

Moreover, the postures of the plurality of forks 41a-41e are inspected for abnormalities by moving the transport base 5 vertically relative to the optical axis L, acquiring the data about the forks 41a-41e from the common optical sensor 62, and judging whether the postures of the forks 41a-41e are normal. Therefore, the inspection can be conducted easily and accurately within a short period of time.

Since the common optical sensor 62 inspects the plurality of forks 41a-41e without opening the loading area 2, the inspection cost is reduced. Further, the inspection is conducted by moving the forks 41a-41e vertically relative to the optical sensor 62. Therefore, increased space savings can be provided because the space required for the inspection is small.

The inspection for abnormal postures of the forks 41a-41e may be conducted again after abnormal forks 41a-41e are adjusted by the operator. In this instance, the levelness of adjusted forks 41a-41e can be automatically verified. Therefore, the accuracy of fork adjustments can be increased.

Figure 11:
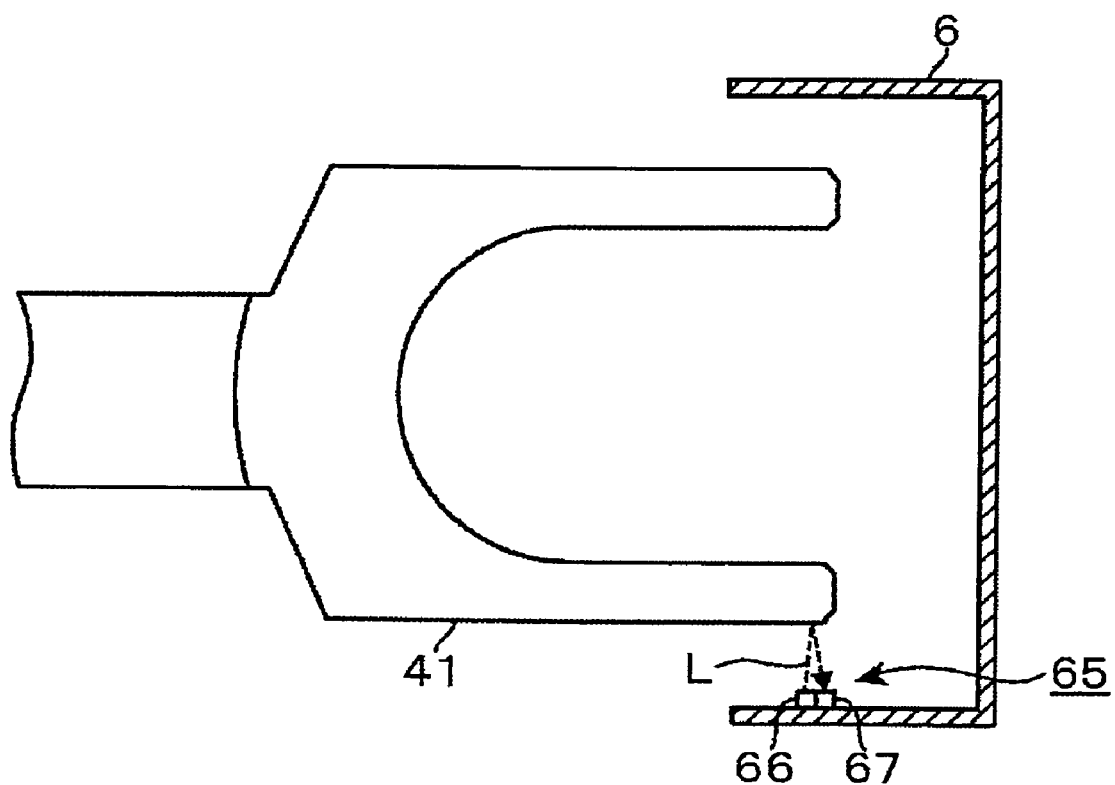
FIG. 11 is a plan view showing an alternative example of an optical sensor.

As shown in FIG. 11, the present invention can use a reflective optical sensor 65 as the optical sensor. In this case, a light emission section 66 and a light reception section 67 are positioned so that the light emitted from the light emission section 66 bounces off the circumferential side surfaces of the forks 41a-41e when the forks 41a-41e are inserted into the inspection position within the housing 61, and that the light reception section 67 is positioned on the optical axis L of the bounced light.

Figure 12A:
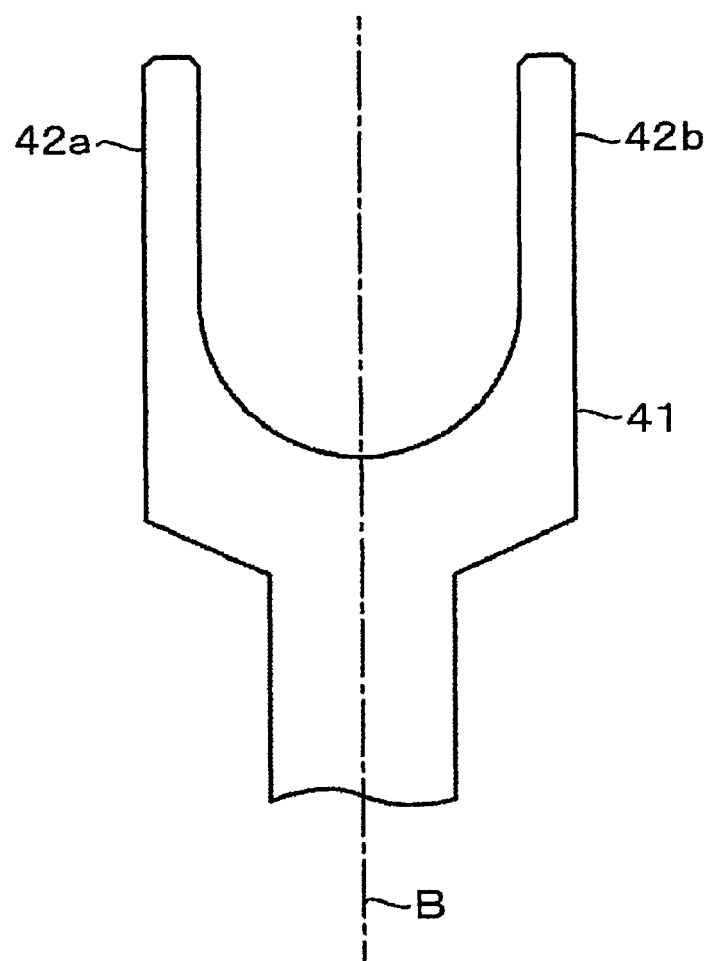
FIGS. 12A and 12B are a plan view and a front view, respectively, that illustrate the inclination of the wafer transport mechanism around an advance/retraction axis.
Figure 12B:
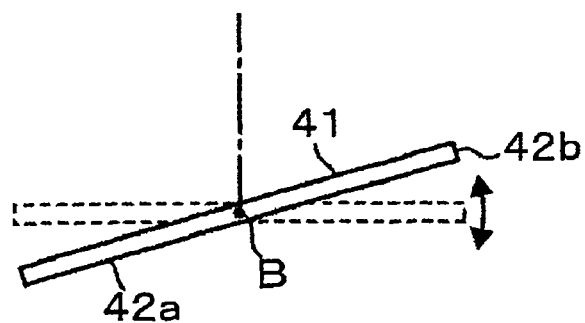

Another embodiment of the present invention, which uses a transmissive optical sensor 62 or a reflective optical sensor 65 to further judge whether the postures of the forks 41a-41e relative to an advance/retraction axis are normal, will now be described. The posture relative to the advance/retraction axis is abnormal if, for instance, a fork 41 is rotated around the advance/retraction axis B as shown in FIGS. 12A and 12B.

When the present embodiment conducts the inspection, it inserts, for instance, the forks 41a-41e into the inspection position of the inspection unit 6. Next, while, for instance, the transport base 5 is lifted from a height at which the first fork 41a is positioned below the optical axis L to a height at which the fifth fork 41e is positioned above the optical axis L of the optical sensor 62, the data fed from the optical sensor 62 are successively acquired with predefined timing and in association with the height of the transport base 5 relative to the optical axis L. When the forks 41a-41e move vertically relative to the optical sensor 62, the thicknesses (height amounts) of the forks 41a-41e that prevail when the forks 41a-41e intercept the optical axis L are acquired by counting the number of pulses generated, for instance, by the encoder 54.

Figure 13:
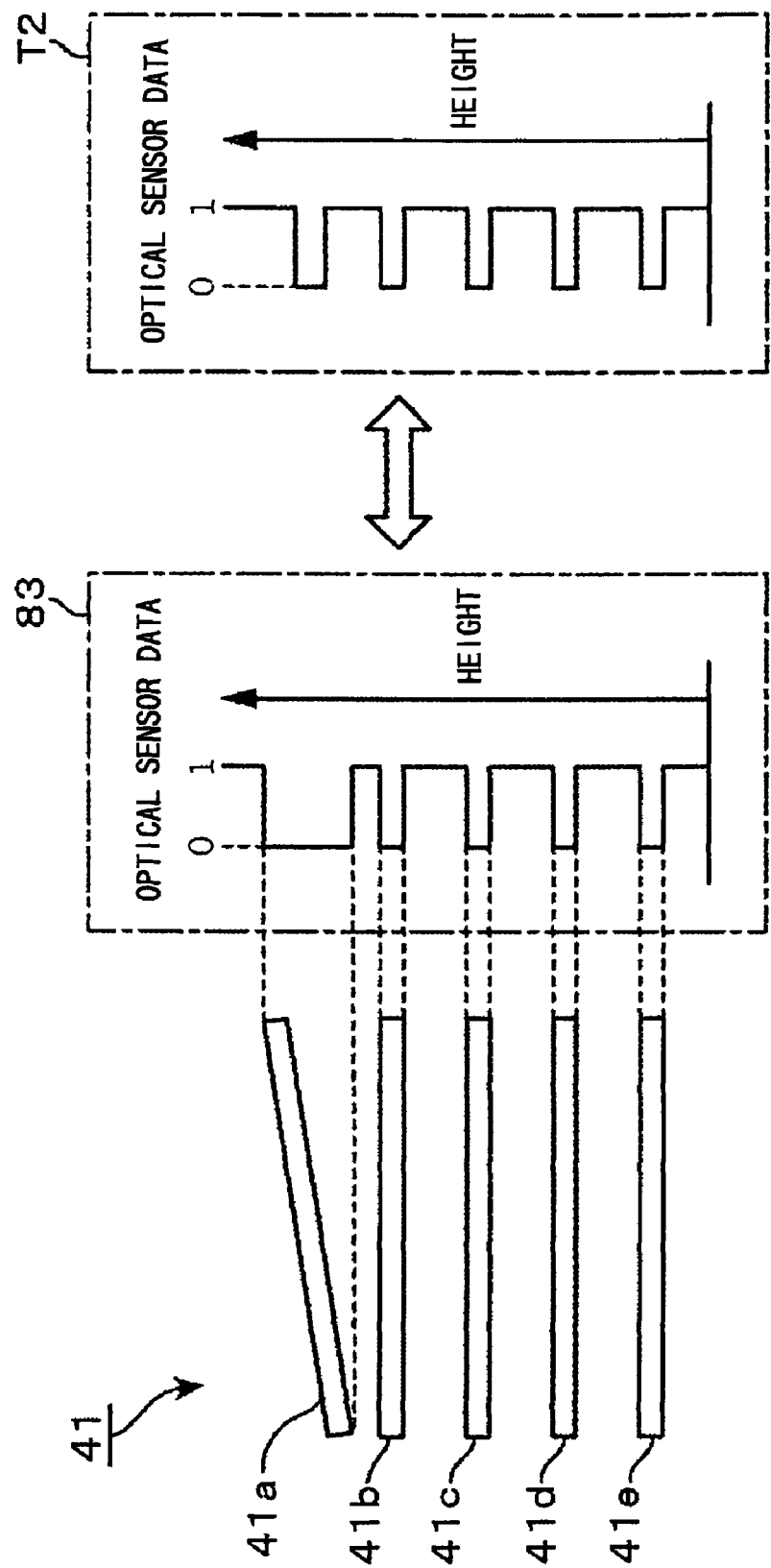
FIG. 13 illustrates a process for inspecting the inclination of the wafer transport mechanism around the advance/retraction axis.

If the first fork 41a is inclined around the advance/retraction axis B as shown, for instance, in FIG. 13, the thickness (height amount) of the fork 41a is increased when it intercepts the optical axis L. The control section 7 stores a reference table T2, which predefines the relationship between the data of the optical sensor 62 and the height data about the forks 41a-41e that prevails when the postures of the forks 41a-41e are normal. In addition, the control section 7 incorporates a judgment means for comparing data 81 acquired during inspection against the data in the reference table T2 and checking whether the thicknesses of the forks 41a-41e are proper, and uses the judgment means to judge whether the forks 41a-41e are inclined around the advance/retraction axis B.

If, for instance, the error between the height amounts of the forks 41a-41e that are indicated by the acquired data 83 and the height amounts of the forks 41a-41e that are indicated by the data in the reference table T2 is within a predetermined range, the control section 7 judges that the postures of the forks 41a-41e are normal, and causes the wafer transport mechanism 4 to start removing the wafers W from the carrier C. If, on the other hand, the error is outside the predetermined range, the control section 7 judges that an abnormality exists, and controls the wafer transport mechanism 4 so that the wafer transport mechanism 4 stops removing the wafers W from the carrier C. Subsequently, the operator adjusts the forks 41a-41e.

As described earlier, when the forks 41a-41e move vertically relative to the optical sensor 62, the present invention can acquire the data about the vertical intervals between neighboring forks 41a-41e by counting the number of pulses generated by the encoder 54. This makes it possible to determine the conditions of the forks 41a-41e and the tendency of temporal changes in the postures of the forks 41a-41e by successively acquiring the data about the intervals between the forks 41a-41e and monitoring the acquired data with predetermined timing. Further, accumulation of the acquired data makes it possible to predict the length of a period of continued fork use that makes the postures of the forks 41a-41e abnormal. Consequently, maintenance can be performed on the forks 41a-41e with predetermined timing before their postures become abnormal.

Still another embodiment of the present invention, which uses a distance sensor 68 as the optical sensor to check whether the front-rear postures of the forks 41a-41e relative to the horizontal plane are normal, will now be described. In the present embodiment, the distance sensor 68 that is used to define a horizontal optical axis L is mounted on a side wall of the housing 61 as shown, for instance, in FIG. 14A. The distance sensor 68 measures the distance between the distance sensor 68 and the circumferential side surfaces of the forks 41a-41e. In this instance, the distance sensor 68 may be mounted on one sidewall of the housing 61 to measure the distance between the distance sensor 68 and the circumferential side surfaces of the forks 41a-41e at one side of the forks 41a-41e. An alternative would be to mount the distance sensor 68 on both sidewalls of the housing 61 and measure the distance between the distance sensor 68 and the circumferential side surfaces of the forks 41a-41e at both sides of the forks 41a-41e.

In the present embodiment, the distance data of a distance sensor 82 that prevails when the transport base 5 is at a height between the first height Z1 and the tenth height Z10 while the postures of the forks 41a-41e are normal is acquired to create a reference table T3 that defines, as shown in FIG. 14B, the relationship between the distance data of the distance sensor 82 and the data indicating the height of the transport base 5 relative to the optical axis L of the distance sensor 82. The created reference table T3 is stored in the control section 7. The control section 7 includes a judgment means that compares the distance data, which is obtained at a predetermined inspection height during inspection, against the data in the reference table T3, and judges whether the postures of the forks 41a-41e are normal.

When the postures of the forks 41a-41e are normal, the acquired data agrees with the distance data in the reference table T3. Therefore, if, for instance, the error between the acquired data and the distance data in the reference table T3 is within a predetermined range, the control section 7 concludes that the postures of the forks 41a-41e are normal, and causes the wafer transport mechanism 4 to start removing the wafers W from the carrier C. If, on the other hand, the error is outside the predetermine range, the control section 7 concludes that an abnormality exists in the postures of the forks 41a-41e, and controls the wafer transport mechanism 4 so that the wafer transport mechanism 4 stops removing the wafers W from the carrier C. Subsequently, the operator adjusts the forks 41a-41e.

In the above instance, the distance data prevailing when the optical axis L is positioned between vertically neighboring forks 41a-41e is greater than the distance data prevailing when the forks 41a-41e cross the optical axis L. Therefore, the data fed from the distance sensor 68 may be acquired as light-reception/no-light-reception data, which indicates that light is received ("1 (ON)") when the acquired distance data is smaller than a preset reference value or indicates that the light is not received ("0 (OFF)") when the acquired distance data is greater than the reference value.

The distance sensor 68 described above may be used to judge whether the left-right postures of the forks 41a-41e relative to the horizontal plane are normal. In this case, the control section 7 includes, for instance, a means that compares the distance data acquired during inspection against the data in the reference table T3 shown in FIG. 14B. When, for instance, the acquired data about the first height Z1 is greater than the distance data in the reference table T3, this means judges that the first fork 41a is inclined leftward as indicated by a one-dot chain line in FIG. 14A. As described above, the forks 41a-41e are inspected for left-right inclination. If the forks 41a-41e are not inclined, the control section 7 concludes that the postures of the forks 41a-41e are normal, and causes the wafer transport mechanism 4 to start removing the wafers W from the carrier C. If, on the other hand, the forks 41a-41e are inclined, the control section 7 concludes that an abnormality exists in the postures of the forks 41a-41e, and controls the wafer transport mechanism 4 so that the wafer transport mechanism 4 stops removing the wafers W from the carrier C. Subsequently, the operator adjusts the forks 41a-41e.

Figure 15A:
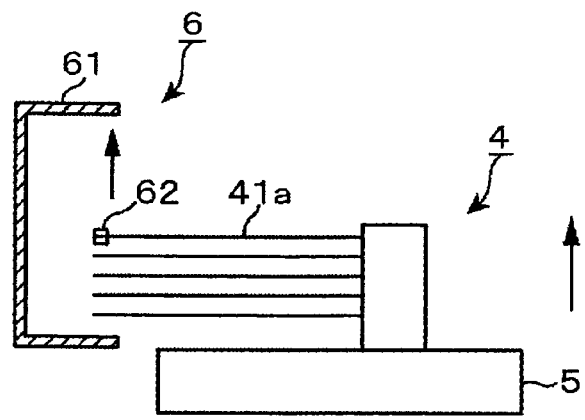
FIGS. 15A to 15C show a typical method of determining the inspection height of the wafer transport mechanism.

An optimum positioning method of determining an inspection height for inspecting the forks 41a-41e for up-down inclination will now be described. First of all, the transport base 5 is lifted from a height at which the first fork 41a crosses the optical axis L to a height at which the fifth fork 41e is positioned above the optical axis L as shown in FIG. 15A. In this instance, the optical sensor 62 acquires the light-reception/no-light-reception data about the forks 41a-41e while the position data about the height of the transport base 5 relative to the optical axis L is acquired as a pulse value for the encoder 54. Then, the relationship between the position data about the height and the data of the optical sensor 62 is obtained as data 1.

Figure 15B:
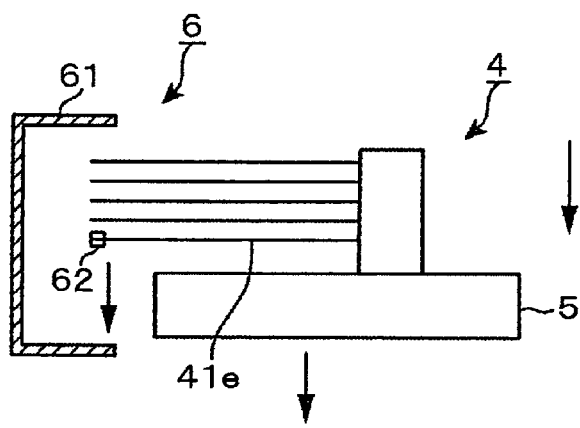

Next, the transport base 5 is lowered from a height at which the fifth fork 41e crosses the optical axis L to a height at which the first fork 41a is positioned below the optical axis L as shown in FIG. 15B. Then, the relationship between the position data about the height and the data of the optical sensor 62 is obtained as data 2 in the same manner as for data 1.

Figure 15C:
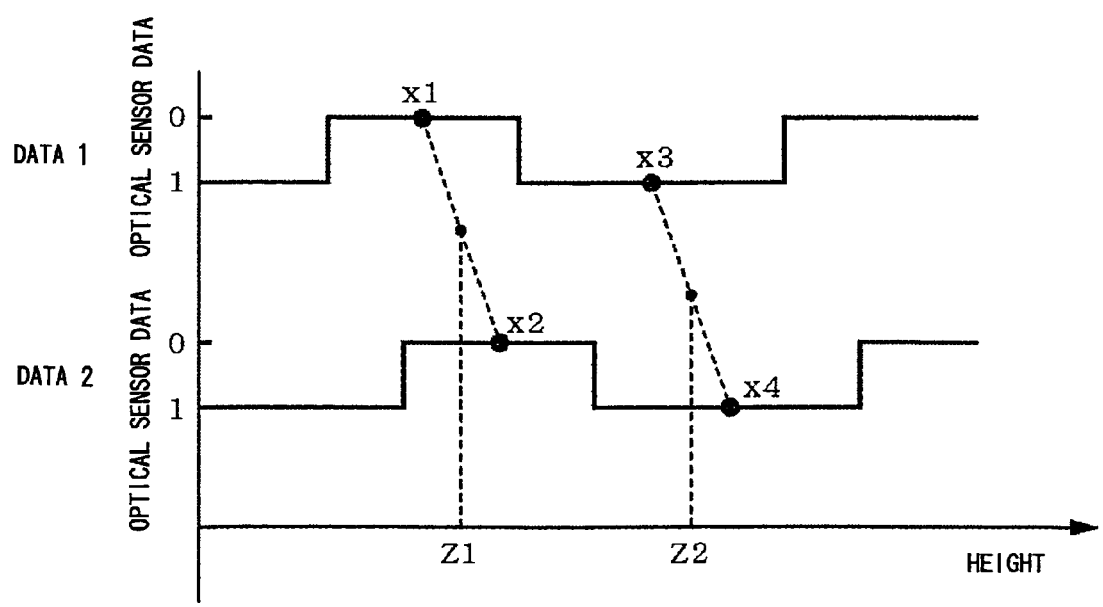
Figure 16:
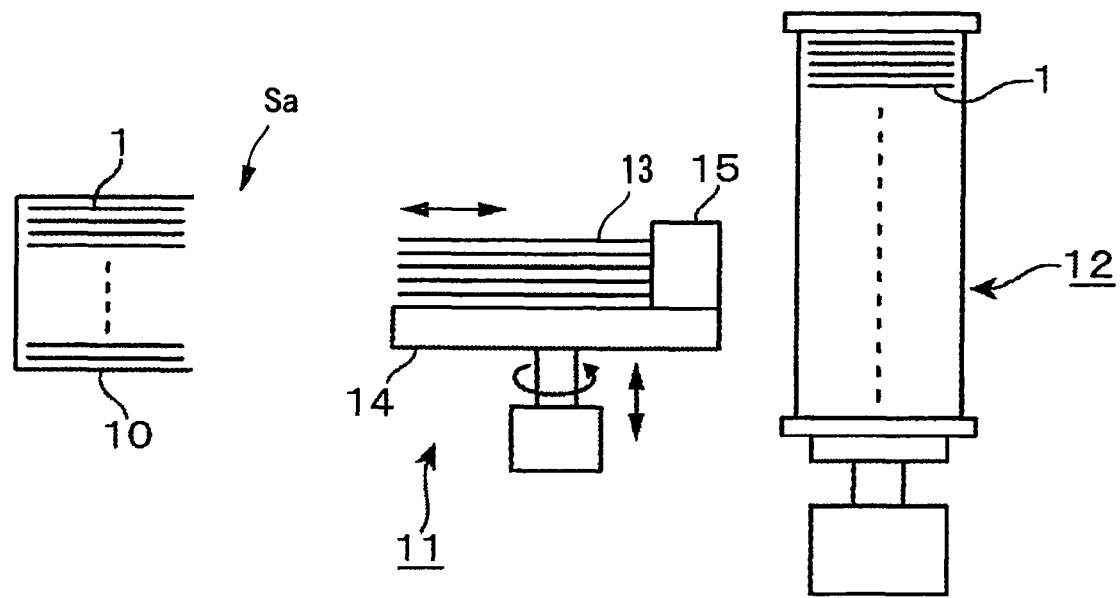
FIG. 16 is a side view illustrating a fork of a conventional transfer apparatus.
Figure 17:
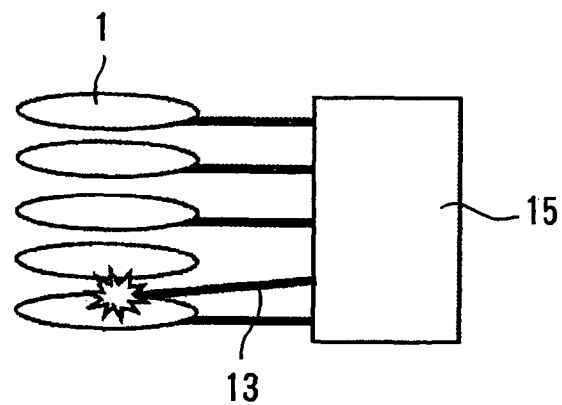
FIG. 17 is a side view illustrating a fork of a conventional transfer apparatus.

FIG. 15C shows data 1 and 2 about the first fork 41a as an example. The data of the optical sensor 62 is "0" when the fork 41a crosses the optical axis L and "1" when the optical axis L is positioned between the first fork 41a and the neighboring fork 41b. It is therefore preferred that the first height Z1 to be set, which is a height at which the first fork 41a crosses the optical axis L while the first fork 41a is in a normal posture, be calculated by determining the average value x1 of the height according to the first data and the average value x2 of the height according to the second data while the optical sensor data is "0" and by averaging the values x1 and x2.

Further, it is preferred that the second height Z2 to be set, which is a height at which the optical axis L is positioned between the first and second forks 41a, 41b while the first and second forks 41a, 41b are in a normal posture, be calculated by determining the average value x3 of the height according to the first data and the average value x4 of the height according to the second data while the optical sensor data is "1" and by averaging the values x3 and x4.

The use of the above determination procedure makes it possible to accurately and automatically determine the height at which the forks 41a-41e cross the optical axis L and the height at which the optical axis L is positioned between the vertically neighboring forks 41a-41e no matter whether the forks 41a-41e are inspected by moving the transport base 5 downward from a position above the optical axis L or upward from a position below the optical axis L. Therefore, the labor required to perform the determination procedure can be considerably reduced as compared with a case where the height for inspection is visually determined by the operator. Further, it is also possible to inhibit the height for inspection from varying.

The prevent invention can also be applied to a wafer transport mechanism 4 having a plurality of forks that can be driven independently of each other. In this case, the forks 41a-41e can be inspected for an abnormal front-rear posture relative to the horizontal plane by inserting the forks 41a-41e one by one into the inspection unit 6 or by simultaneously inserting the plurality of forks 41a-41e into the inspection unit 6.

If, in the above case, one 41a of the plurality of forks 41a-41e is judged to be abnormal, the control section 7 may control the wafer transport mechanism 4 to refrain from using the abnormal fork 41a and use only the remaining normal forks 41b-41e. In this instance, the wafer transport mechanism 4 may stop the apparatus after transferring all the wafers W remaining in the carrier C to the wafer boat 32 with only the normal forks 41b-41e. Subsequently, the operator may adjust the abnormal fork 41a.

Further, the present invention may include a plurality of vertical thermal treatment apparatuses 200, let a host computer control these apparatuses, and inspect the forks 41a-41e for an abnormal posture during a period of time during which no lot processing is performed. If, in this instance, an abnormality is found in the postures of the forks 41a-41e before actual lot processing, the host computer is informed of such an abnormality. Then, the host computer may improve the efficiency of a plant's automatic production line by exercising control so that the lots to be processed by an apparatus in which an abnormal fork posture has been found are reassigned to the other apparatuses.

The present invention can also inspect for an abnormal front-rear posture of the advance/retraction axis of an advance/retraction mechanism 45 relative to the horizontal plane. In this case, optical sensors 62 acquire light-reception/no-light-reception data at two locations in the advance/retraction direction of the forks 41a-41e (e.g., at a location near the leading end and at a location near the base end). The acquired data and the height of the transport base 5 are used to judge whether the advance/retraction axis is vertically inclined.

More specifically, if the data fed from the optical sensors 62 at the two locations differ from each other, the advance/retraction axis is judged to be vertically inclined. Consequently, the posture of the advance/retraction axis is judged to be abnormal.

The present invention can also be applied to a substrate transport means having only one retention arm. In a situation where the substrate transport means has a plurality of retention arms, the same number of optical sensors as retention arms may be used to simultaneously inspect for abnormal front-rear postures of the retention arms relative to the horizontal plane. Alternatively, a plurality of optical sensors may be used to simultaneously inspect some of the plurality of retention arms for an abnormal posture.

The present invention can also be applied to an apparatus having two vertically aligned carriers C. In this case, each carrier C may be provided with an inspection unit that is positioned close to the carrier C. The holder according to the present invention includes not only the carrier C but also the wafer boat 32. The inspection unit may be positioned near the wafer boat 32.

Although the foregoing embodiments have been described with reference to a semiconductor wafer transfer apparatus, the present invention can also be applied to an apparatus that transfers glass substrates for use, for instance, in an FPD (Flat Panel Display) or a mask.

What is claimed is:

1. A substrate transfer apparatus that is mounted in a substrate processing apparatus to accommodate a plurality of substrates, the substrate transfer apparatus comprising:
    a holder for holding the plurality of substrates in a shelf form;
    substrate transport means that removes a substrate from the holder, the transport means including a substantially horizontal retention arm which retains the substrate and is positioned to freely advance and retract along an advance/retraction axis, and a transport base which is connected to the retention arm and supports the retention arm;
    an optical sensor that is used to define a horizontal optical axis, which crosses a circumferential side surface of the retention arm when the optical sensor ascends or descends relative to the transport base;
    elevator means that is coupled to the transport base to lift or lower the transport base relative to the optical sensor;
    height detection means that is connected to the elevator means to detect the height of the transport base relative to the optical axis; and
    a control section having judgment means that is connected to the optical sensor and the height detection means to judge, in accordance with a light-reception/no-light-reception detection result fed from the optical sensor, which is obtained when the transport base ascends or descends relative to the optical sensor while no substrate is held by the retention arm, and the height of the transport base, whether the posture of the retention arm relative to the horizontal plane is a predefined posture or not;
    wherein, when the judgment means judges that the posture of the retention arm relative to the horizontal plane is not the predefined posture, the control section exercises to stop the substrate transport means before a next substrate is removed from the holder.

2. The substrate transfer apparatus according to claim 1, wherein a plurality of retention arms are stacked on the transport base so that the retention arms can advance and retract simultaneously or independently of each other.

3. The substrate transfer apparatus according to claim 2, wherein the elevator means lifts or lowers the transport base in such a manner that the plurality of retention arms cross the optical axis of a common optical sensor, and wherein the judgment means of the control section judges whether the posture of each of the plurality of retention arms is the predefined posture or not.

4. The substrate transfer apparatus according to claim 1, wherein a plurality of retention arms are stacked on the transport base so that the retention arms can advance and retract independently of each other, and wherein, when the posture of one retention arm is judged to be not the predefined posture, the control section controls the substrate transport means so that another retention arm removes a substrate from the holder.

5. The substrate transfer apparatus according to claim 1, wherein the judgment means of the control section also judges, in accordance with the height of the transport base and the light-reception/no-light-reception detection result fed from the optical sensor, whether the posture of the retention arm relative to the advance/retraction axis is the predefined posture or not.

6. The substrate transfer apparatus according to claim 1, wherein the optical sensor is a distance sensor, and wherein the judgment means also judges, in accordance with the height of the transport base and the distance between the distance sensor and the retention arm, whether the left-right posture of the retention arm is the predefined posture or not.

7. A substrate transfer method for use in a substrate transfer apparatus having a holder for holding a plurality of substrates in a shelf form; substrate transport means that removes a substrate from the holder, the transport means including a substantially horizontal retention arm which retains the substrate and is positioned to freely advance and retract along an advance/retraction axis, and a transport base which is connected to the retention arm and supports the retention arm; and an optical sensor that is used to define a horizontal optical axis, which crosses a circumferential side surface of the retention arm when the optical sensor ascends or descends relative to the transport base; the substrate transfer method comprising the steps of:
    lifting or lowering the transport base relative to the optical sensor while no substrate is held by the retention arm and acquiring the height of the transport base relative to the optical axis and a light-reception/no-light-reception detection result fed from the optical sensor;
    judging, in accordance with the height of the transport base and the light-reception/no-light-reception detection result fed from the optical sensor, whether the posture of the retention arm relative to the horizontal plane is a predefined posture or not; and
    exercising control to stop the substrate transport means before a next substrate is removed from the holder when the posture of the retention arm relative to the horizontal plane is judged to be not the predefined posture.

8. The substrate transfer method according to claim 7, further comprising the step of judging, in accordance with the height of the transport base and the light-reception/no-light-reception detection result fed from the optical sensor, whether the posture of the retention arm relative to the advance/retraction axis is the predefined posture.

9. The substrate transfer method according to claim 7, wherein the optical sensor is a distance sensor, the substrate transfer method further comprising the step of judging, in accordance with the height of the transport base and the distance between the distance sensor and the retention arm, whether the left-right posture of the retention arm is the predefined posture.

10. A non-transitory computer readable storage medium that stores a computer program running on a computer and is used with a substrate transfer method for use in a substrate transfer apparatus having a holder for holding a plurality of substrates in a shelf form; substrate transport means that removes a substrate from the holder, the transport means including a substantially horizontal retention arm which retains the substrate and is positioned to freely advance and retract along an advance/retraction axis, and a transport base which is connected to the retention arm and supports the retention arm; and an optical sensor that is used to define a horizontal optical axis, which crosses a circumferential side surface of the retention arm when the optical sensor ascends or descends relative to the transport base;

wherein the substrate transfer method includes the steps of:

lifting or lowering the transport base relative to the optical sensor while no substrate is held by the retention arm and acquiring the height of the transport base relative to the optical axis and a light-reception/no-light-reception detection result fed from the optical sensor;

judging, in accordance with the height of the transport base and the light-reception/no-light-reception detection result fed from the optical sensor, whether the posture of the retention arm relative to the horizontal plane is a predefined posture or not; and exercising control to stop the substrate transport means before a next substrate is removed from the holder when the posture of the retention arm relative to the horizontal plane is judged to be not the predefined posture.

* * * * *